US012562704B2

(12) United States Patent
Darthenay

(10) Patent No.: US 12,562,704 B2
(45) Date of Patent: Feb. 24, 2026

(54) AMPLIFIER CIRCUIT

(71) Applicant: NXP B.V., Eindhoven (NL)

(72) Inventor: Frederic Darthenay, Luc Sur Mer (FR)

(73) Assignee: NXP B.V., Eindhoven (NL)

( * ) Notice: Subject to any disclaimer, the term of this patent is extended or adjusted under 35 U.S.C. 154(b) by 16 days.

(21) Appl. No.: 18/655,916

(22) Filed: May 6, 2024

(65) Prior Publication Data

US 2024/0380372 A1      Nov. 14, 2024

(30) Foreign Application Priority Data

May 12, 2023    (EP) ..................................... 23305752

(51) Int. Cl.
      H03F 3/45          (2006.01)
      H03F 1/26          (2006.01)
      H03F 3/00          (2006.01)
(52) U.S. Cl.
      CPC ........... H03F 3/45973 (2013.01); H03F 1/26 (2013.01); H03F 3/005 (2013.01); H03F 3/45475 (2013.01)
(58) Field of Classification Search
      CPC ........ H03F 3/45973; H03F 1/26; H03F 3/005; H03F 3/45475; H03F 2203/45044; H03F 2203/45534; H03F 1/30; H03F 1/24; H03F 3/68; H03F 3/45968; H03F 1/3205; H03F 1/32; H03F 1/3211; H03F 3/00; H03F 3/04; H03F 3/16; H03F 1/307; H03K 5/2481; H03K 5/007
      See application file for complete search history.

(56) References Cited

U.S. PATENT DOCUMENTS

| | | |
|---|---|---|
| 4,143,362 A | 3/1979 | Ulmer |
| 4,587,443 A | 5/1986 | van de Plassche |
| 4,748,418 A | 5/1988 | Kerth |
| 5,812,005 A | 9/1998 | Ezell et al. |
| 7,394,309 B1 | 7/2008 | Pontanin et al. |
| 7,764,215 B2 | 7/2010 | Wan et al. |
| 8,258,864 B1 | 9/2012 | Chan et al. |

(Continued)

FOREIGN PATENT DOCUMENTS

| | | |
|---|---|---|
| EP | 0407859 A1 | 1/1991 |
| EP | 1091489 B1 | 10/2008 |

OTHER PUBLICATIONS

Christian C . Enz, Circuit Techniques for reducing the effects of Op-Amp Imperfections : Autozeroing, Correlated Double Sampling, and Chopper Stabilization , pp. 1584-1614 , vol. 84. No 11. Nov. 1996.

(Continued)

*Primary Examiner* — Jung Kim

(57)          ABSTRACT

An amplifier circuit comprising: a first-stage residue-reduction storage unit; a final-stage residue-reduction storage unit; and a switching network. The switching network is operable to control the amplifier circuit according to the following operational configurations: a first residue-reduction configuration; a second residue-reduction configuration; and an operational configuration. Such an amplifier circuit uses a low number of residue-reduction steps to reduce global residual voltage to a very low level when the amplifier circuit is subsequently used in the operational configuration.

12 Claims, 13 Drawing Sheets

(56) References Cited

U.S. PATENT DOCUMENTS

| | | | |
|---|---|---|---|
| 9,319,013 B2 | 4/2016 | Kuo | |
| 2012/0242404 A1 | 9/2012 | Rajasekhar | |
| 2014/0091846 A1 | 4/2014 | Agut | |
| 2014/0176238 A1 | 6/2014 | Guo et al. | |
| 2016/0079941 A1* | 3/2016 | Zhong ................. H03F 3/45475 | |
| | | | 330/9 |

OTHER PUBLICATIONS

Khorramabadi Haideh : "Niquist Rate ADC: Comparator Design",
Nov. 8, 2007, pp. 1-30 , EECS 247 Lecture 21.

* cited by examiner 408, 409

605

AMPLIFIER CIRCUIT

CROSS-REFERENCE TO RELATED APPLICATIONS

This application claims priority under 35 U.S.C. § 119 to European patent application no. 23305752.0, filed May 12, 2023, the contents of which are incorporated by reference herein.

FIELD

The present disclosure relates to an amplifier circuit, and in particular to one that can successively reduce the effects of a residual voltage at the output of the amplifier circuit over a sequence of residue-reduction steps.

SUMMARY

According to a first aspect of the present disclosure there is provided an amplifier circuit comprising:
a first amplifier circuit input terminal;
a second amplifier circuit input terminal;
a first amplifier circuit output terminal;
a second amplifier circuit output terminal;
an amplifier stage comprising:
  a first amplifier stage input terminal;
  a second amplifier stage input terminal;
  a first amplifier stage output terminal;
  a second amplifier stage output terminal;
wherein the first amplifier stage output terminal is connected to the first amplifier circuit output terminal and the second amplifier stage output terminal is connected to the second amplifier circuit output terminal;
a first-stage residue-reduction storage unit and a final-stage residue-reduction storage unit, which each comprise;
  a first capacitor that is connected to the first amplifier stage input terminal; and
  a second capacitor that is connected to the second amplifier stage input terminal;
  wherein each capacitor comprises a first plate and a second plate;
a switching network that is operable to control the amplifier circuit according to the following operational configurations:
  a first residue-reduction configuration, in which:
    the first amplifier circuit input terminal is not connected to the first amplifier stage input terminal;
    the second amplifier circuit input terminal is not connected to the second amplifier stage input terminal;
    the first amplifier stage output terminal is connected to the first capacitor of the first-stage residue-reduction storage unit;
    the second amplifier stage output terminal is connected to the second capacitor of the first-stage residue-reduction storage unit;
    the first amplifier stage output terminal is not connected to the first capacitor of the final-stage residue-reduction storage unit;
    the second amplifier stage output terminal is not connected to the second capacitor of the final-stage residue-reduction storage unit;
  a second residue-reduction configuration, in which:
    the first amplifier circuit input terminal is not connected to the first amplifier stage input terminal;

the second amplifier circuit input terminal is not connected to the second amplifier stage input terminal;
the first amplifier stage output terminal is not connected to the first capacitor of the first-stage residue-reduction storage unit;
the second amplifier stage output terminal is not connected to the second capacitor of the first-stage residue-reduction storage unit;
the first amplifier stage output terminal is connected to the first capacitor of the final-stage residue-reduction storage unit;
the second amplifier stage output terminal is connected to the second capacitor of the final-stage residue-reduction storage unit;
an operational configuration, in which:
  the first amplifier circuit input terminal is connected to the first amplifier stage input terminal;
  the second amplifier circuit input terminal is connected to the second amplifier stage input terminal;
  the first amplifier stage output terminal is not connected to the first capacitor of the first-stage residue-reduction storage unit;
  the second amplifier stage output terminal is not connected to the second capacitor of the first-stage residue-reduction storage unit;
  the first amplifier stage output terminal is not connected to the first capacitor of the final-stage residue-reduction storage unit;
  the second amplifier stage output terminal is not connected to the second capacitor of the final-stage residue-reduction storage unit.

Such an amplifier circuit advantageously requires a low number (e.g. 2 to 5) of residue-reduction steps to reduce global residual voltage (offset) to a very low level when the amplifier circuit is subsequently used in the operational configuration. This technique not only applies for offset compensation but extends to any signal processing.

In one or more embodiments, the first capacitor of the final-stage residue-reduction storage unit may be indirectly connected to the first amplifier stage input terminal via the first capacitor of the first-stage residue-reduction storage unit. The second capacitor of the final-stage residue-reduction storage unit may be indirectly connected to the second amplifier stage input terminal via the second capacitor of the final-stage residue-reduction storage unit.

In one or more embodiments, when the amplifier circuit is in the operational configuration:
the first amplifier circuit input terminal may be indirectly connected to the first amplifier stage input terminal via: i) the first capacitor of the final-stage residue-reduction storage; and ii) the first capacitor of the first-stage residue-reduction storage unit; and
the second amplifier circuit input terminal may be indirectly connected to the second amplifier stage input terminal via: i) the second capacitor of the final-stage residue-reduction storage; and ii) the second capacitor of the first-stage residue-reduction storage unit.

In one or more embodiments, the amplifier stage may comprise a first set of amplifier stage input terminals and a second set of amplifier stage input terminals. The first capacitor of the final-stage residue-reduction storage unit may be indirectly connected to a first amplifier stage input terminal of the first set of amplifier stage input terminals via the first capacitor of the first-stage residue-reduction storage unit. The second capacitor of the final-stage residue-reduction storage unit may be indirectly connected to a second amplifier stage input terminal of the first set of amplifier stage input terminals via the second capacitor of the final-stage residue-reduction storage unit. When the amplifier circuit is in the operational configuration: the first amplifier circuit input terminal may be connected to a first amplifier stage input terminal of the second set of amplifier stage input terminals; and the second amplifier circuit input terminal may be connected to a second amplifier stage input terminal of the second set of amplifier stage input terminals.

In one or more embodiments, the amplifier stage may comprise a differential circuit comprising: a first transistor having: a gate terminal, a back-gate terminal and a conduction channel; a second transistor having: a gate terminal, a back-gate terminal and a conduction channel; and a current source. The gate terminal of the first transistor may be connected to the first amplifier stage input terminal of the second set of amplifier stage input terminals. The gate terminal of the second transistor may be connected to the second amplifier stage input terminal of the second set of amplifier stage input terminals. The back-gate terminal of the first transistor may be connected to the first amplifier stage input terminal of the first set of amplifier stage input terminals. The back-gate terminal of the second transistor may be connected to the second amplifier stage input terminal of the first set of amplifier stage input terminals. The current source may be configured to provide output signalling to the first amplifier stage output terminal via the conduction terminal of the first transistor. The current source may be configured to provide output signalling to the second amplifier stage output terminal via the conduction terminal of the second transistor.

In one or more embodiments, the amplifier stage may comprises a first set of amplifier stage input terminals, a second set of amplifier stage input terminals, and a third set of amplifier stage input terminals. The first capacitor of the first-stage residue-reduction storage unit may be connected to a first amplifier stage input terminal of the first set of amplifier stage input terminals. The second capacitor of the first-stage residue-reduction storage unit may be connected to a second amplifier stage input terminal of the first set of amplifier stage input terminals. The first capacitor of the final-stage residue-reduction storage unit may be connected to a first amplifier stage input terminal of the second set of amplifier stage input terminals. The second capacitor of the final-stage residue-reduction storage unit may be connected to a second amplifier stage input terminal of the second set of amplifier stage input terminals. When the amplifier circuit is in the operational configuration: the first amplifier circuit input terminal may be connected to a first amplifier stage input terminal of the third set of amplifier stage input terminals; and the second amplifier circuit input terminal may be connected to a second amplifier stage input terminal of the third set of amplifier stage input terminals.

In one or more embodiments, the amplifier stage may comprise a differential circuit comprising: a first transistor having: a gate terminal, a back-gate terminal and a conduction channel; a second transistor having: a gate terminal, a back-gate terminal and a conduction channel; a third transistor having: a gate terminal, a back-gate terminal and a conduction channel; a fourth transistor having: a gate terminal, a back-gate terminal and a conduction channel; a first current source; and a second current source. The gate terminal of the first transistor may be connected to the first amplifier stage input terminal of the third set of amplifier stage input terminals. The gate terminal of the second transistor may be connected to the second amplifier stage input terminal of the third set of amplifier stage input terminals. The gate terminal of the third transistor may be connected to the first amplifier stage input terminal of the third set of amplifier stage input terminals. The gate terminal of the fourth transistor may be connected to the second amplifier stage input terminal of the third set of amplifier stage input terminals. The back-gate terminal of the first transistor may be connected to the first amplifier stage input terminal of the first set of amplifier stage input terminals. The back-gate terminal of the second transistor may be connected to the second amplifier stage input terminal of the first set of amplifier stage input terminals. The back-gate terminal of the third transistor may be connected to the first amplifier stage input terminal of the second set of amplifier stage input terminals. The back-gate terminal of the fourth transistor may be connected to the second amplifier stage input terminal of the second set of amplifier stage input terminals. The first current source may be configured to provide output signalling to the first amplifier stage output terminal via the conduction terminal of the first transistor. The first current source may be configured to provide output signalling to the second amplifier stage output terminal via the conduction terminal of the second transistor. The second current source may be configured to provide output signalling to the first amplifier stage output terminal via the conduction terminal of the third transistor. The second current source may be configured to provide output signalling to the second amplifier stage output terminal via the conduction terminal of the fourth transistor.

In one or more embodiments, the amplifier stage may comprise a differential circuit comprising: a first transistor having: a gate terminal, a back-gate terminal and a conduction channel; a second transistor having: a gate terminal and a conduction channel; a third transistor having: a gate terminal and a conduction channel; a fourth transistor having: a gate terminal and a conduction channel; a fifth transistor having: a gate terminal and a conduction channel; a sixth transistor having: a gate terminal and a conduction channel; a first current source; a second current source; and a third current source. The gate terminal of the first transistor may be connected to the first amplifier stage input terminal of the third set of amplifier stage input terminals. The gate terminal of the second transistor may be connected to the second amplifier stage input terminal of the third set of amplifier stage input terminals. The gate terminal of the third transistor may be connected to the first amplifier stage input terminal of the first set of amplifier stage input terminals. The gate terminal of the fourth transistor may be connected to the second amplifier stage input terminal of the first set of amplifier stage input terminals. The gate terminal of the fifth transistor may be connected to the first amplifier stage input terminal of the second set of amplifier stage input terminals. The gate terminal of the sixth transistor may be connected to the second amplifier stage input terminal of the second set of amplifier stage input terminals. The first current source may be configured to provide output signalling to the first amplifier stage output terminal via the conduction terminal of the first transistor. The first current source may be configured to provide output signalling to the second amplifier stage output terminal via the conduction terminal of the second transistor. The second current source may be configured to provide output signalling to the first amplifier stage output terminal via the conduction terminal of the third transistor. The second current source may be configured to provide output signalling to the second amplifier stage output terminal via the conduction terminal of the fourth transistor. The third current source may be configured to provide output signalling to the first amplifier stage output terminal via the conduction terminal of the fifth transistor. The third current source may be configured to provide output signalling to the second amplifier stage output terminal via the conduction terminal of the sixth transistor.

In one or more embodiments, the switching network may comprise first-stage residue-reduction short circuit switches that, when closed, provide a connection between the first plates of the capacitors of the first-stage residue-reduction storage unit and a reference terminal.

In one or more embodiments, the switching network may comprise final-stage residue-reduction short circuit switches that are connected between: i) a node between the first plate of a respective final-stage capacitor and the second plate of the corresponding respective first-stage capacitor; and ii) a reference terminal.

In one or more embodiments, the capacitors of the final-stage residue-reduction storage unit may have a higher capacitance than those of the first-stage residue-reduction storage unit.

In one or more embodiments, one or more switches of the switching network may further comprise a charge injection compensation switch.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets.

The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIGS. 6b-d depict arrangements for building the amplifier stage of FIG. 6a;

FIG. 7b shows a plot that illustrates the performance of the circuit of FIG. 7a;

FIG. 8b shows a plot that illustrates the performance of the circuit of FIG. 8a.

DETAILED DESCRIPTION

The compensation of offset voltage and improvement of charge transfer accuracy of analogue circuitry, such as for a comparator, gain stage, or integrator, presents significant challenges. This is particularly the case when very high accuracy is desired. Furthermore, as technology nodes scale down (in terms of gate length), the dynamic range of a signal decreases but the intrinsic offset of the components remains relatively high, and the intrinsic available gain decreases. For example, post-processing at 16-bit accuracy with a 3V dynamic requires 12 μV (microvolt) accuracy but the intrinsic offset of the electronic circuitry is of the order of a few mV (when driven by a noise constraint).

Different techniques can be used to compensate the offset and loss of intrinsic gain of an amplifier. Regarding offset compensation, these techniques can be classified into three main categories: i. analogue domain techniques (as will be discussed with reference to FIGS. 1a and 1b); ii. mixed analogue and digital techniques (as will be discussed with reference to FIG. 2); and iii. chopping techniques (as will be discussed with reference to FIG. 3).

Figure 1A:
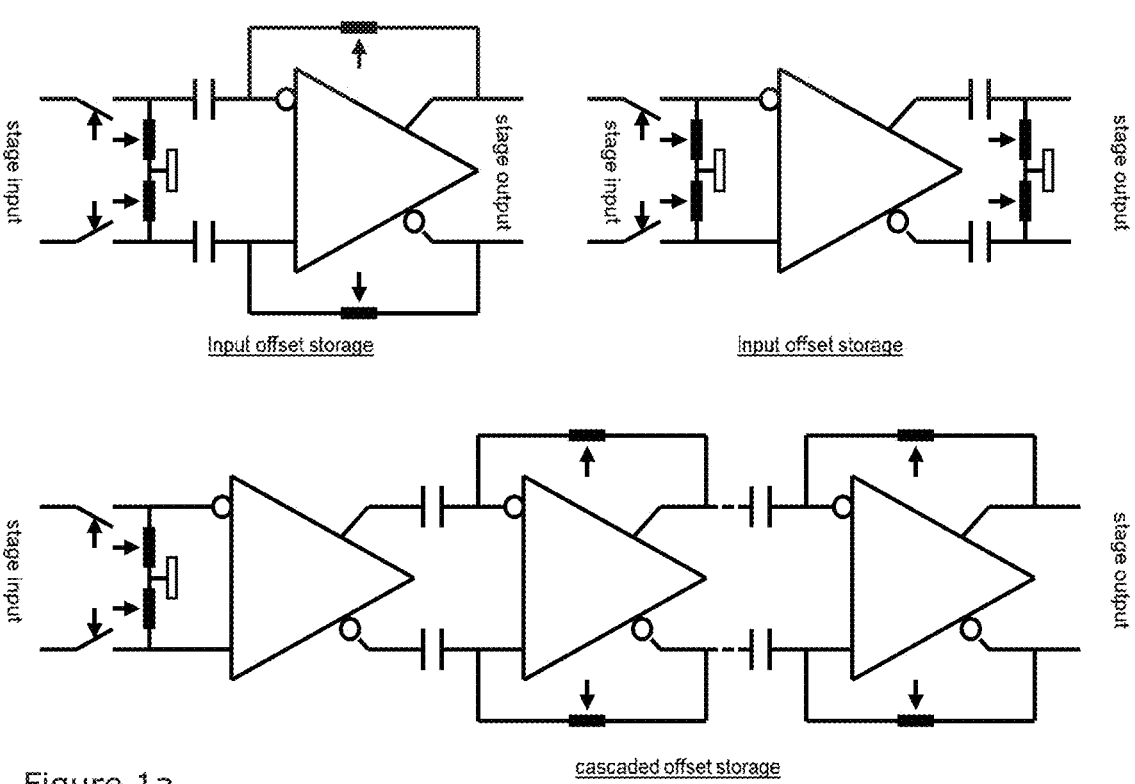
FIGS. 1a and 1b show analogue domain techniques for compensating offset and loss of intrinsic gain of an amplifier.
Figure 1B:
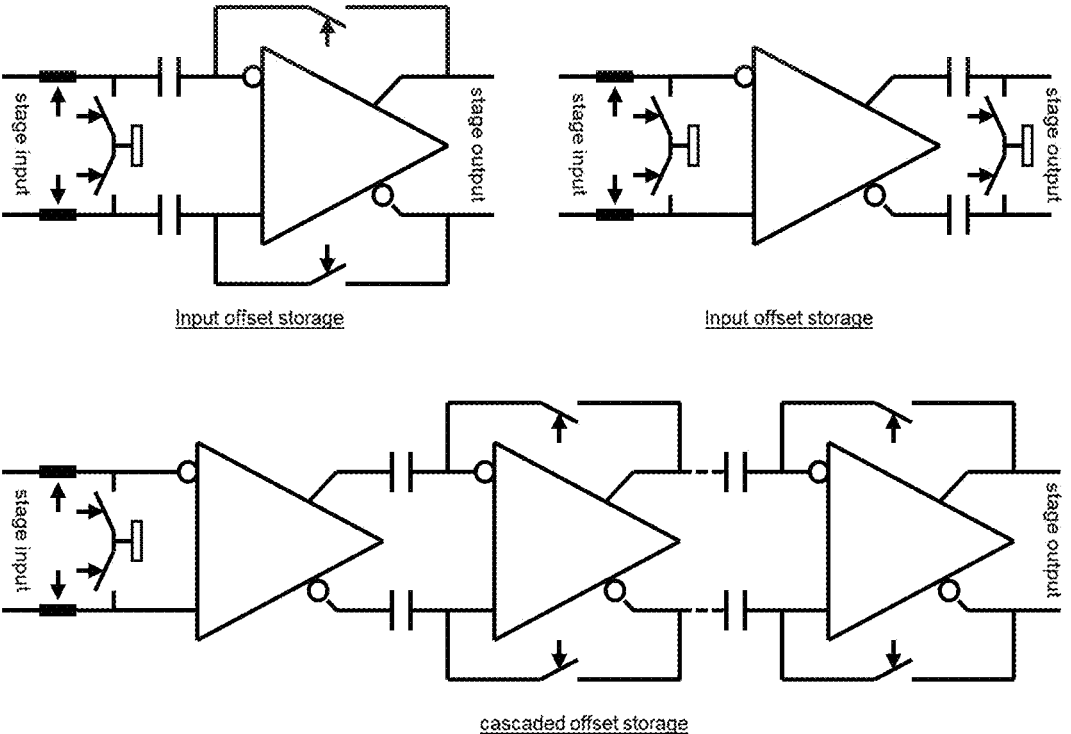

FIGS. 1a and 1b summarise analogue domain techniques. FIG. 1a shows calibration phases of operation. FIG. 1b shows subsequent amplification phases of operation. The offset compensation can occur through either a single stage or multiple cascaded stages. The technique involves ac-coupling. Cancellation of the offset can be implemented at either the input or the output. It is worth noting that cancelling the offset at the output may not be desirable for larger offsets, as the stage would quickly saturate.

Advantages of this technique include:

Convergence occurs in a single clock cycle.

The circuitry is basic (storage unit and few switches).

Small area on a PCB or die silicon.

Disadvantages of this technique include:

When cancellation is implemented at the outputs, the stage can saturate in the case where the input offset is too large.

When cancellation is implemented at the inputs, the remaining/residual offset fed back to the input cannot be nulled, the offset at the input instead having a value approximately equal to the intrinsic offset of the amplifier stage divided by the voltage gain of the amplifier stage (Off@input=Off_intrinsic/Gdc). This is a major drawback as the technology does not offer a high voltage gain (Gdc). To reach high accuracy multiple stages are cascaded; as a consequence their dynamic behavior suffers from high settling time, high recovery time from saturation in case no reset techniques are used, etc.

The offset cannot be stored in a memory, so re-calibration is required each time IC boots.

The storage unit is prone to charge leakage, so frequent refreshing must take place. Therefore, this technique cannot be applied in continuous mode except if the calibration is run at each sample time or if interleaving method involving an extra comparator is used.

FIG. 1a depicts the calibration phase, where the stage inputs are shorted and the op amp outputs are fed back to the op amp inputs, resulting in an output (also input) voltage of $dVout=Gdc*(-dVout+Off)=Off*Gdc/(1+Gdc)$. This voltage is stored across both capacitors as $dVcal=dVout=Off*Gdc/(1+Gdc)$.

FIG. 1b depicts the amplification phase, where the feedback and input stage switches are open, so any input stage signal increase dVsig (from equilibrium) propagates (we assume no attenuation for explanation) to the amplifier inputs and is amplified by Gdc. dVout increases by $Gdc*dVsig$, resulting in $dVout=dVout@cal\_phase+Gdc*dVsig$, meaning that the residual offset fed back to the stage input is $Off/(1+Gdc)$.

Figure 2:
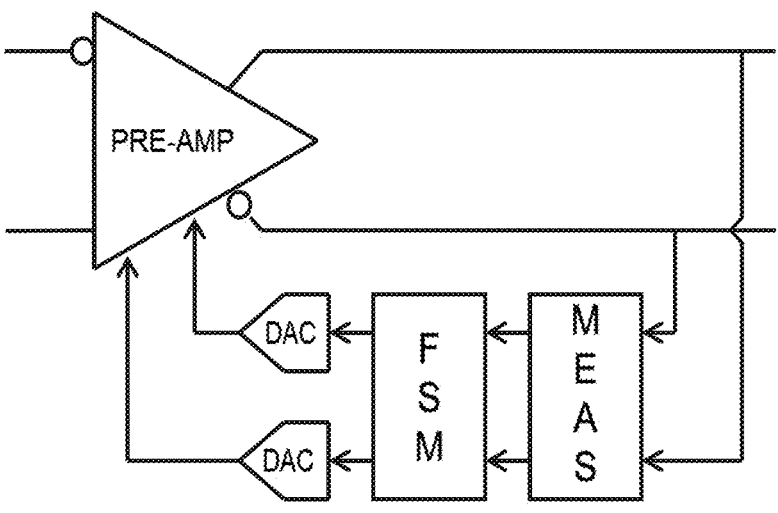
FIG. 2 shows a mixed analogue and digital technique example embodiment of a mixed analogue and digital domain technique for compensating offset and loss of intrinsic gain of an amplifier.

FIG. 2 shows a mixed analogue and digital technique. This technique involves a comparator, sensing circuitry, digital circuitry and digital to analogue conversion (DAC) feedback. The compensation happens in multiple clock cycles through use of a SAR (successive-approximation register technique) as SAR ADC. The feedback circuitry can be a digital to analogue converter of any type (current, capacitor, voltage, . . . ), or a charge pump. The sensing circuitry can be based on the comparator result, the comparator delay, or the comparator transition time.

Advantages of this technique include:
No issue with offset cancellation leakage.
Can be stored in non-volatile memory; therefore recalibration is not required each time IC boots.
Disadvantages of this technique include:
Accuracy is limited by feedback DAC accuracy.
Many clock cycles are required to converge.
Huge area on PCB.

Figure 3:
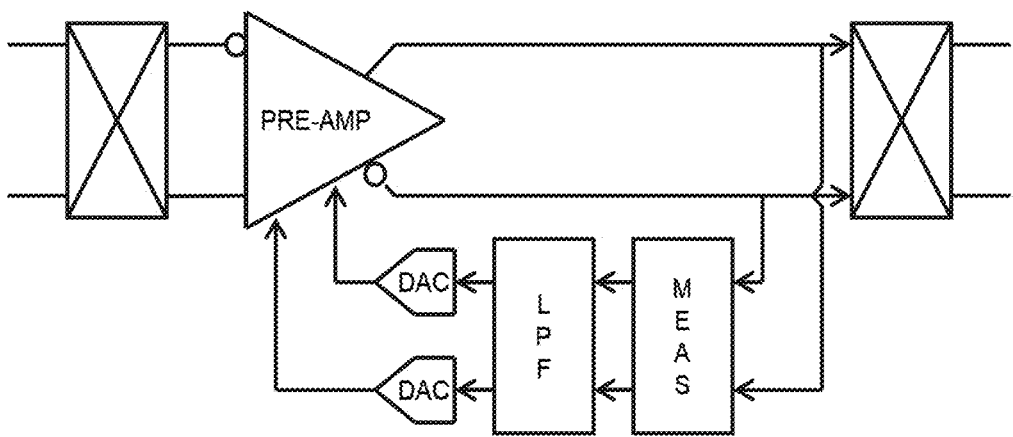
FIG. 3 shows a chopping technique for compensating offset and loss of intrinsic gain of an amplifier.

FIG. 3 depicts a chopping technique. The chopping signal is assumed to be a random signal. The signal is "whitened" at input by multiplying it by a random signal in temporal domains. In the frequency domain, the input signal spectrum is convoluted by the random signal spectrum. As the random signal spectrum shows a flat PSD (power spectral density), the resulting signal shows a flat spectrum too; which proves that the resulting signal is like a noise signal with a flat PSD; and therefore like a "white noise" random signal. Then the offset accumulates and is filtered by a low pass filter to anneal the "whitened signal" and determine the offset. The resulting signal (that is an image of the offset) is sensed and fed back for compensation until the filter outputs zero value. The number of clock cycles required to achieve the desired accuracy depends on the filter bandwidth and on the input signal bandwidth. This technique can be used in the background. The feedback takes place either in digital domain or in analogue domain.

Advantages of this technique include:
No issue with offset cancellation leakage.
Can be stored in non-volatile memory, therefore recalibration is not required each time IC boots.
Disadvantages of this technique include:
Accuracy is limited by feedback DAC accuracy.
Many clock cycles required for the filter to converge.
Suffer from some signal content dependency.
Huge area on PCB.

A plurality of techniques can be used to enhance amplifier gain, which can be classified into three categories:

1. Multistage: The Amplifier is Composed of a Plurality of Cascaded Stages (e.g. 3 Maximum).
Advantages:
High gain.
Medium supply voltage.
Disadvantages:
Stability: beside the "Miller" compensation technique, a plurality of other techniques exist.
Difficult to reach high FUG (Frequency Unity Gain) at low power.
Slew recovery in the case of saturation.
2. Regulated Cascode:
Advantages:
High gain.
High supply voltage.
Disadvantages:
High supply voltage.
Limited amount of gain.
Sensitivity to leakage.
3. Ring Amplifier:
Advantages:
Less prone to instability.
Enhanced settling at medium accuracy thanks to high slew rate capability.
Low supply voltage.
High power efficiency.
Disadvantages:
Medium gain
Difficult to bias "dead zone" in all corners.
Slow settling at high accuracy.

Advantageous examples that are described below can be considered as including a combination of the "analogue" and "mixed" techniques. They can work in analogue only domains and advantageously require only a few (e.g. 2 to 5) consecutive residue-reduction steps to converge to the final accuracy. As will be discussed below, they can involve multiple storage units (combination of switches and capacitors) arranged to apply correction in one of the following ways: "stacked-ac-coupling", "stacked-dc-coupling", or "parallel-dc-coupling". There can be one storage unit per residue-reduction step, where each storage unit stores part of the residual voltage of the preceding residue-reduction steps. All together, these steps add together to produce global offset residual voltage compensation. Over successive residue-reduction steps, the global residual voltage (offset) compensation refines more and more. At each residue-reduction step the residual voltage (offset) is partly cancelled, a new residual voltage (offset) is produced; and a storage unit stores the current residual voltage (offset) result. From step to step the residual voltage (offset) compensation adds ("stacks"); all together they advantageously contribute to reduce global residual voltage (offset) to a very low level. This technique not only reduces for offset compensation but extends to any signal processing.

Figure 4A:
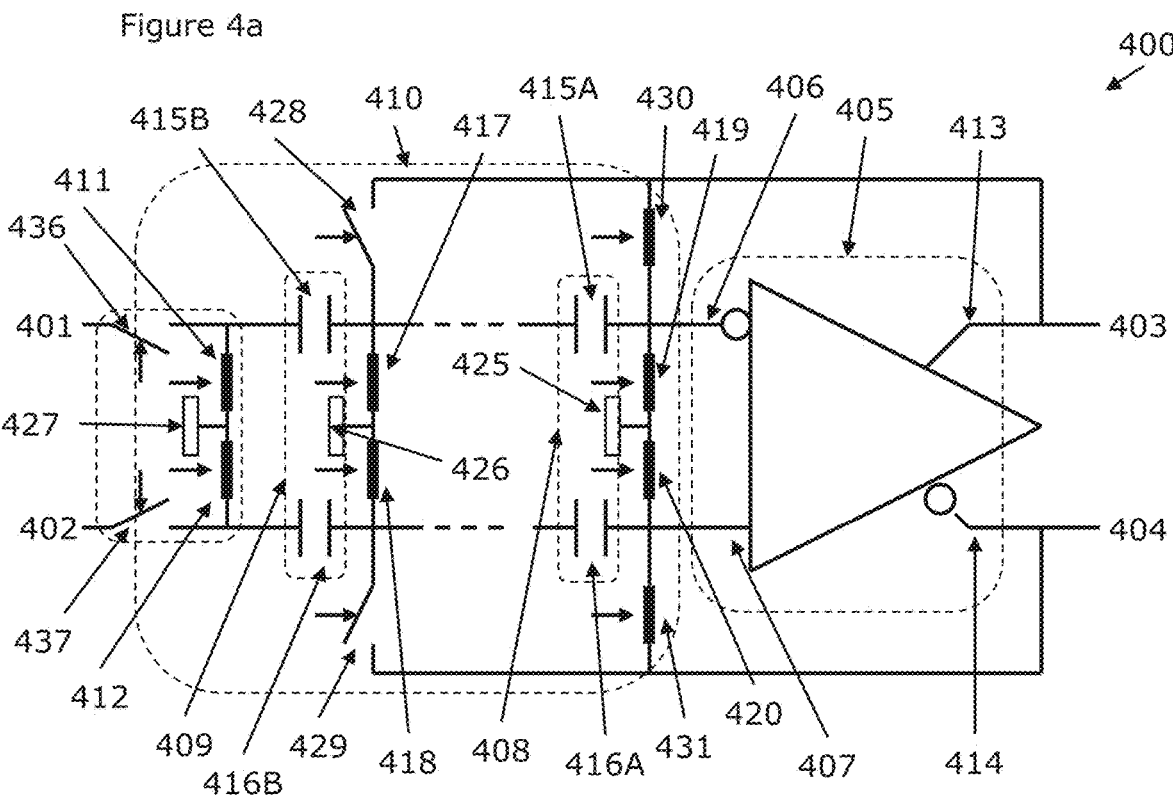
FIG. 4a shows an example embodiment of an amplifier circuit of the present disclosure.

FIG. 4a shows an example embodiment of an amplifier circuit 400, which can also be referred to as a successive-residue-reduction amplifier circuit. The amplifier circuit 400 in this example provides "stacked-ac-coupling" correction, as identified above. As will be appreciated from the following description, the example of FIG. 4a can be considered as providing stacked-ac-coupling storage, in series with the input signalling.

The circuit of FIG. 4a (and indeed also FIGS. 4b to 5g) depicts an open loop signal processing configuration. Once offset has been cleaned, the output signal if $dVout=Gol*dVin$; where dVout is the output voltage of the amplifier circuit; Gol is the gain factor of the amplifier circuit; and dVin is the input voltage of the amplifier circuit. This configuration is well-suited for building comparator circuitry.

The amplifier circuit 400 has a first amplifier circuit input terminal 401, a second amplifier circuit input terminal 402, a first amplifier circuit output terminal 403, and a second amplifier circuit output terminal 404. As will be discussed below, the first amplifier circuit input terminal 401 and the second amplifier circuit input terminal 402 receive input differential signalling. The first amplifier circuit output terminal 403 and the second amplifier circuit output terminal 404 provide output differential signalling, which is an amplified version of the received input differential signalling. The amplifier circuit 400 also includes an amplifier stage 405 comprising: a first amplifier stage input terminal 406, a second amplifier stage input terminal 407, a first amplifier stage output terminal 413, and a second amplifier stage output terminal 414. The first amplifier stage output terminal 413 is connected directly to the first amplifier circuit output terminal 403 in this example. The second amplifier stage output terminal 414 is connected directly to the second amplifier circuit output terminal 404 in this example.

The amplifier circuit 400 also has at least a first-stage residue-reduction storage unit 408 and a final-stage residue-reduction storage unit 409. The first-stage residue-reduction storage unit 408 comprises a first first-stage capacitor 415A, having a first plate and a second plate. The first-stage residue-reduction storage unit 408 also comprises a second first-stage capacitor 416A, having a first plate and a second plate. The final-stage residue-reduction storage unit 409 comprises a first final-stage capacitor 415B, having a first capacitor plate and a second capacitor plate. The final-stage residue-reduction storage unit 409 also comprises a second final-stage capacitor 416B, having a first plate and a second plate. As will be discussed below, these capacitors 415A, 416A, 415B, 416B will be used to store charge based on a residual voltage at the output of the amplifier stage 415 when the amplifier circuit 400 is in a residue-reduction configuration, such that they can then be used to offset the residual voltage when the amplifier circuit 400 is in a subsequent operational configuration.

The amplifier circuit 400 also has a switching network 410 that is operable to control the amplifier circuit 400 so that it is put in one of a plurality of configurations such that the capacitors 415A, 416A, 415B, 416B of the storage units 408, 409 are sequentially connected to the amplifier stage output terminals 413, 414 by first-stage switches 430, 431 and final-stage switches 428, 429, respectively, of the switching network 410, as will be discussed in detail below.

The first plate of the first first-stage capacitor 415A is connected to the first amplifier stage input terminal 406 and is also selectively connectable to the first amplifier stage output terminal 413 via the switching network 410. The first plate of the second first-stage capacitor 416A is connected to the second amplifier stage input terminal 407 and is also selectively connectable to the second amplifier stage output terminal 414 via the switching network 410.

The first plate of the first final-stage capacitor 415B is connected to the second plate of the first first-stage capacitor 415A. In this way, the first final-stage capacitor 415B is indirectly connected to the first amplifier stage input terminal 406; that is, it is connected to the first amplifier stage input terminal 406 via the first first-stage capacitor 415A. The first plate of the first final-stage capacitor 415B is also selectively connectable to the first amplifier stage output terminal 413 via the switching network 410.

The first plate of the second final-stage capacitor 416B is connected to the second plate of the second first-stage capacitor 416A. In this way the second final-stage capacitor 416B is indirectly connected to the second amplifier stage input terminal 407, via the second first-stage capacitor 416A. The first plate of the second final-stage capacitor 416B is also selectively connectable to the second amplifier stage output terminal 414 via the switching network 410.

The amplifier circuit input terminals 401, 402 are selectively connectable to the second plates of the corresponding final-stage capacitors 415B, 416B of the final-stage residue reduction unit 409. In this way, each of the two amplifier circuit input terminals 401, 402 can be connected to a respective one of the amplifier stage input terminals 406, 407 (via the capacitors 415B, 416B of the final-stage residue reduction unit 409 and the capacitors 415A, 416A of the first-stage residue reduction unit 408) so that the amplifier stage 405 can amplify the signalling at the amplifier circuit input terminals 401, 402 when the amplifier circuit 400 is in the operational configuration. Also, the two amplifier circuit input terminals 401, 402 can be disconnected from the amplifier stage input terminals 406, 407 when the amplifier circuit 400 is in a residue-reduction configuration.

When the first residue-reduction storage unit 408 is connected to the amplifier stage output terminals 413, 414, the first capacitor 415A of the first residue-reduction storage unit 408 is charged by the residual voltage (offset) at the first amplifier stage output terminal 413. Also, the second capacitor 416A of the first residue-reduction storage unit 408 is charged by the residual voltage (offset) at the second amplifier stage output terminal 414. In the next step of the sequence, the first-stage residue-reduction storage unit 408 is disconnected from the amplifier stage output terminals 413, 414 and the final-stage residue-reduction storage unit 409 is connected to the amplifier stage output terminals 413, 414. Then, the first capacitor 415B of the final-stage residue-reduction storage unit 409 is charged by the residual voltage (offset) at the first amplifier stage output terminal 413, and the second capacitor 416B of the final-stage residue-reduction storage unit 409 is charged by the residual voltage (offset) at the second amplifier stage output terminal 414. In this way, the residue-reduction process runs in successive sequential cycles. At each step, the residual offset correction adds to the previous correction term by charging the capacitors in the next residue-reduction storage unit. So, at each subsequent step, the residual offset (that is, the remaining part of the offset after the preceding residue-reduction steps) is reduced by about the DC gain value of the amplifier stage. This is because an additional capacitor, that is charged by an amount that will reduce the residue offset, is connected to each of the inputs of the amplifier stage. Due to the sequential nature of the residue-reduction process, the residual offset can be made very low without requiring a huge DC gain value at the amplifier stage 405.

The following discussion outlines the various operational configurations of the amplifier circuit 400 in greater detail.

In this example, the amplifier circuit 400 has a first residue-reduction configuration, in which the amplifier stage 405 is disconnected from the amplifier circuit input terminals 401, 402 such that it does not receive input signalling from the amplifier circuit input terminals 401, 402. Also, the first-stage residue-reduction storage unit 408 is connected to the amplifier stage output terminals 413, 414 by respective ones of the first-stage switches 430, 431 such that the capacitors 415A, 416A of the first-stage residue-reduction storage unit 408 are charged by a residual offset voltage that is present at the output of the amplifier stage 405. One of the first-stage switches 430 is connected in series between the first plate of the first first-stage capacitor 415A and the first amplifier stage output terminal 413. The other of the first-stage switches 431 is connected in series between the first plate of the second first-stage capacitor 416A and the second amplifier stage output terminal 414. None of the other residue-reduction storage units are connected to the amplifier stage output terminals 413, 414 in the first residue-reduction configuration.

Specifically, in the first residue-reduction configuration, the states of switches in the switching network 410 are controlled such that: the first amplifier circuit input terminal 401 is not connected to the first amplifier stage input terminal 406; and the second amplifier circuit input terminal 402 is not connected to the second amplifier stage input terminal 407. The first amplifier stage output terminal 413 is connected to the first capacitor 415A of the first-stage residue-reduction storage unit 408, such that the first capacitor 415A of the first-stage residue-reduction storage unit 408 is charged by a residual voltage at the first amplifier stage output terminal 413. The second amplifier stage output terminal 414 is connected to the second capacitor 416A of the first-stage residue-reduction storage unit 408 such that the second capacitor 416A of the first-stage residue-reduction storage unit 408 is charged by a residual voltage at the second amplifier stage output terminal 414. The first amplifier stage output terminal 413 is not connected to the first capacitor 415B of the final-stage residue-reduction storage unit 409 such that the first capacitor 415B of the final-stage residue-reduction storage unit 409 is not charged by a residual voltage at the first amplifier stage output terminal 413. The second amplifier stage output terminal 414 is not connected to the second capacitor 416B of the final-stage residue-reduction storage unit 409 such that the second capacitor 416B of the final-stage residue-reduction storage unit 409 is not charged by a residual voltage at the second amplifier stage output terminal 414. In this way, in the first residue-reduction configuration, the capacitors 415A, 416A of only the first-stage residue-reduction storage unit 408 are charged in such a way that the undesirable effects caused by the offset of the amplifier stage 405 are reduced for subsequent use of the circuit 400 when it is configured to amplify input signalling.

In this example, the circuit 400 also has a second residue-reduction configuration. In the example of FIG. 4a, since there are only two residue-reduction storage units, the second residue-reduction configuration is also the final residue-reduction configuration. In the second residue-reduction configuration, the amplifier stage 405 is again disconnected from the amplifier circuit input terminals 401, 402 such that it does not receive input signalling from the amplifier circuit input terminals 401, 402. Also, the final-stage residue-reduction storage unit 409 is connected to the amplifier stage output terminals 413, 414 such that the capacitors 415B, 416B of the final-stage residue-reduction storage unit 409 are charged by a residual offset voltage that is present at the output of the amplifier stage 405. The residual offset voltage that is present at the output of the amplifier stage 405 for the second residue-reduction configuration will be less than it was for the first residue-reduction configuration because the capacitors 415A, 416A that were charged while the amplifier circuit 400 was in the first residue-reduction configuration serve to reduce the residual offset voltage that is present when the amplifier circuit 400 is in a subsequent configuration. One of the final-stage switches 428 is connected in series between the first plate of the first final-stage capacitor 415B and the first amplifier stage output terminal 413. The other of the final-stage switches 431 is connected in series between the first plate of the second final-stage capacitor 416B and the second amplifier stage output terminal 414. None of the other residue-reduction storage units are connected to the amplifier stage output terminals 413, 414 in the second residue-reduction configuration.

Specifically, in the second residue-reduction configuration, the states of switches in the switching network 410 are controlled such that: the first amplifier circuit input terminal 401 is not connected to the first amplifier stage input terminal 406; and the second amplifier circuit input terminal 402 is not connected to the second amplifier stage input terminal 407. The first amplifier stage output terminal 413 is not connected to the first capacitor 415A of the first-stage residue-reduction storage unit 408 such that the first capacitor 415A of the first-stage residue-reduction storage unit 408 is not charged by a residual voltage at the first amplifier stage output terminal 413. The second amplifier stage output terminal 414 is not connected to the second capacitor 416A of the first-stage residue-reduction storage unit 408 such that the second capacitor 416A of the first-stage residue-reduction storage unit 408 is not charged by a residual voltage at the second amplifier stage output terminal 414. The first amplifier stage output terminal 413 is connected to the first capacitor 415B of the final-stage residue-reduction storage unit 409 such that the first capacitor 415B of the final-stage residue-reduction storage unit 409 is charged by a residual voltage at the first amplifier stage output terminal 413. The second amplifier stage output terminal 414 is connected to the second capacitor 416B of the final-stage residue-reduction storage unit 409 such that the second capacitor 416B of the final-stage residue-reduction storage unit 409 is charged by a residual voltage at the second amplifier stage output terminal 414. In this way, the capacitors 415B, 416B of only the final-stage residue-reduction storage unit 409 are charged in such a way that the undesirable effects caused by the offset of the amplifier stage 405 are further reduced (i.e. reduced by more than they were for the first residue-reduction configuration) for subsequent use of the circuit 400 when it is configured to amplify input signalling.

The amplifier circuit 400 also has an operational configuration, in which the amplifier stage 405 is configured to receive input signalling from the amplifier circuit input terminals 401, 402. Also, the residue-reduction storage units 408, 409 are not connected to the amplifier stage output terminals 413, 414. In this way, the residual offset voltage stored on the capacitors 415A, 416A of the first-stage residue-reduction storage unit 408 adds together with the voltage stored on capacitors 415B, 416B of the final-stage residue-reduction storage unit 409, respectively, to produce a global offset compensation voltage that compensates for the offset voltage when the input signalling is applied to the amplifier stage input terminals 406, 407.

Specifically, in the operational configuration, the first amplifier circuit input terminal 401 is connected to the first amplifier stage input terminal 406. The second amplifier circuit input terminal 402 is connected to the second amplifier stage input terminal 407. The first amplifier stage output terminal 413 is not connected to the first capacitor 415A of the first-stage residue-reduction storage unit 408. The second amplifier stage output terminal 414 is not connected to the second capacitor 416A of the first-stage residue-reduction storage unit 408. The first amplifier stage output terminal 413 is not connected to the first capacitor 415B of the final-stage residue-reduction storage unit 409. The second amplifier stage output terminal 414 is not connected to the second capacitor 416B of the final-stage residue-reduction storage unit 409. In this way, the circuit 400 is configured to amplify the input signal applied to the amplifier stage input terminals 406, 407 in such a way that the charge that was stored on the capacitors 415A, 416A, 415B, 416B during the earlier residue-reduction configurations reduces the undesirable effects caused by the offset of the amplifier stage 405 at the amplifier circuit output terminals 403, 404.

In this example, the switching network 410 includes a plurality of residue-reduction short circuit switches 417, 418, 419, 420, two for each of eth residue-reduction storage units 408, 409.

First-stage residue-reduction short circuit switches 419, 420 are operable to provide a reset for the capacitors 415A, 416A of the first-stage residue-reduction storage unit 408. That is, when the first-stage residue-reduction short circuit switches 419, 420 are closed they provide a connection between the first plates of the capacitors 415A, 416A of the first-stage residue-reduction storage unit 408 and a reference terminal 425. In this example the reference terminal 425 is a ground terminal. In this way, the capacitors 415A, 416A of the first-stage residue-reduction storage unit 408 can be discharged, and therefore reset, when the first-stage residue-reduction short circuit switches 419, 420 are closed. When the first-stage residue-reduction short circuit switches 419, 420 are open, the associated capacitors 415A, 416A of the first-stage residue-reduction storage unit 408 hold their charge such that they can be used to provide an offset to the respective amplifier stage input terminals 406, 407 and thereby reduce the residual offset voltage at the outputs of the amplifier stage 405.

Final-stage residue-reduction short circuit switches 417, 418 are connected between: i) a node between the first plate of a respective final-stage capacitor 415B, 416B and the second plate of the corresponding respective first-stage capacitor 415A, 416A; and ii) a reference terminal 426. The final-stage residue-reduction short circuit switches 417, 418 are configured to selectively connect the second plates of the first and second first-stage capacitors 415A, 416A to a reference terminal 426 such as to complete a circuit such that the capacitors 415A, 416A of the first-stage residue-reduction storage unit 408 can be charged when the first plates of the capacitors 415A, 416A of first-stage residue-reduction storage unit 408 are also connected to the amplifier stage output terminals 413, 414. The final-stage residue-reduction short circuit switches 417, 418 are also configured to provide a reset for the capacitors 415B, 416B of the final-stage residue-reduction storage unit 408. That is, when the final-stage residue-reduction short circuit switches 417, 418 are closed they provide a connection between the first plates of the capacitors 415B, 416B of the final-stage residue-reduction storage unit 409 and the reference terminal 426. In this example the reference terminal 426 is a ground terminal. The final-stage residue-reduction short circuit switches 417, 418 function substantially in the same way as the first-stage residue-reduction short circuit switches 419, 420.

When the first-stage residue-reduction short circuit switches 419, 420 are open, the first-stage capacitors 415A, 416A hold their charge such that it is provided to the respective amplifier stage input terminals 406, 407. When the final-stage residue-reduction short circuit switches 417, 418 are open, the first plates of the final-stage capacitors 415B, 416B hold their charge such that it is provided to the amplifier stage input terminals 406, 407 (indirectly) via the series connection with the first-stage capacitors.

The switching network 410 in this example also includes two input short circuit switches 411, 412, each of which is configured to connect the second plates of a respective one of the final-stage capacitors 415B, 416B to a reference terminal 427. These switches function to complete a circuit such that the final-stage capacitors 415B, 416B of the final-stage residue-reduction storage unit 409 can be charged when the first plates of the final-stage capacitors 415B, 416B of the final-stage residue-reduction storage unit 409 are connected to the amplifier stage output terminals 413, 414.

The switching network 410 also includes a first input disconnection switch 436 and a second input disconnection switch 437. The first input disconnection switch 436 is connected in series between the first amplifier circuit input terminal 401 and the second plate of the first capacitor 415B of the final-stage residue-reduction storage unit 409. The first input disconnection switch 436 is open when the amplifier circuit 400 is in a residue-reduction configuration, such that any input signalling that is received at the first amplifier circuit input terminal 401 is not provided to the amplifier stage 405. The first input disconnection switch 436 is closed when the amplifier circuit 400 is in the operational configuration, such that any input signalling that is received at the first amplifier circuit input terminal 401 is provided to the amplifier stage 405. The second input disconnection switch 437 is connected in series between the second amplifier circuit input terminal 402 and the second plate of the second capacitor 416B of the final-stage residue-reduction storage unit 409. The second input disconnection switch 437 is open when the amplifier circuit 400 is in a residue-reduction configuration, such that any input signalling that is received at the second amplifier circuit input terminal 402 is not provided to the amplifier stage 405. The second input disconnection switch 437 is closed when the amplifier circuit 400 is in the operational configuration, such that any input signalling that is received at the second amplifier circuit input terminal 402 is provided to the amplifier stage 405.

When a switch of the switching network 410 opens, noise that results from this event contributes to the residual voltage of the amplifier stage 405. The magnitude of this noise value is dependent on the size of the capacitor that is connected to the switch. That is, a higher capacitance will reduce the noise contribution associated with a switching event. It can be especially important to account for this noise contribution during the residual-reduction that is provided by the final-stage residual-reduction storage unit 409, since it is this noise value that will be seen when the amplifier circuit input terminals 401, 402 are subsequently connected to the amplifier stage input terminals 406, 407 during the operational configuration. Therefore, to reduce the noise that will be present when the amplifier stage 405 is used to amplify input signalling, the final-stage capacitors 415B, 416B of the final-stage residue-reduction storage unit 409 can have a higher capacitance than the first-stage capacitors 415A, 416A of the first-stage residue-reduction storage unit 408 (and any other residue-reduction storage units that may be provided).

One or more switches of the switching network 410 may further comprise a charge injection compensation switch in order to improve the accuracy of the residue-reduction. The implementation of the charge injection compensation switch involves splitting the final-stage switches 428, 429 of the switching network 410 (which connect the final-stage capacitors 415B, 416B to the amplifier stage output terminals 413, 414 into multiple sub-switches that are provided in parallel with each other and are controlled such that they are switched off sequentially. The final sub-switch can be the smallest. Anytime a switch opens it injects some charge (the amount of charge is proportional to the switch size). As the remaining switches are still closed these injected charges can be cleaned. Therefore, splitting these final-stage switches 428, 429 into N parts in this way can reduce charge injection.

Figure 4B:
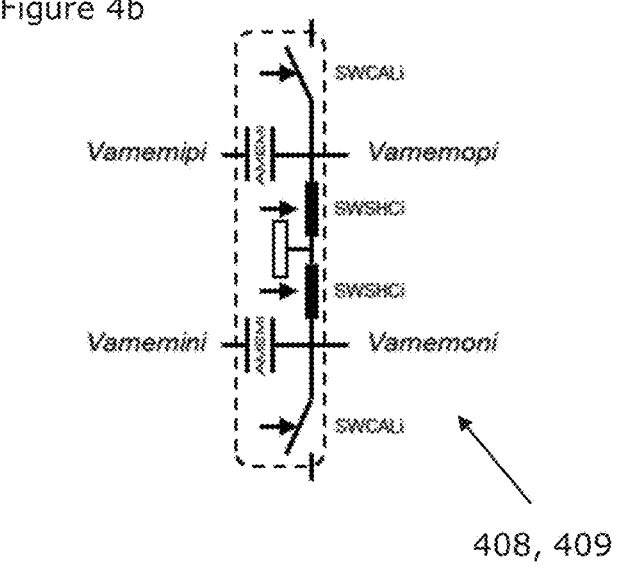
FIG. 4b shows an example embodiment of a storage unit of FIG. 4a, in combination with parts of the switching network.

FIG. 4b depicts an example embodiment of a storage unit 408, 409 of FIG. 4a, in combination with parts of the switching network 410. FIG. 4b shows the following components, using the labels that are used in FIG. 4b.

Feedback calibration switches (SWCALi): the switches of the switching network 410 that connect the capacitors 415A, 416A, 415B, 416B of a storage unit 408, 409 to the amplifier stage output terminals 413, 414.

Short circuit switches (SWSHCi): corresponding to first-stage residue-reduction short circuit switches 419, 420 for the first-stage residue-reduction storage unit 408, or final-stage residue-reduction short circuit switches 417, 418 for the final-stage residue-reduction storage unit 409.

Analogue voltage storage element (AMEMi): corresponding to the capacitors 415A, 416A or 415B, 416B of a storage unit.

Charge injection compensation switches (SWINJj) (not shown): the inclusion of charge injection compensation switches is an additional feature that may be included when high accuracy is desired by reducing the effects of noise that occurs when switches are opened or closed. The implementation of the charge injection compensation switch involves splitting the last SWCALi switch into multiple parts that switch off sequentially. To reduce charge injection, the last SWCALi can be split into Ninj parts, as will be detailed below.

The amplifier stage of any of the amplifier circuits 400 disclosed herein can be provided with a single set of input terminals (as shown in FIG. 4a) or with multiple sets of input terminals (as will be described with reference to FIGS. 4c and 4d).

Figures 4C, 4D:
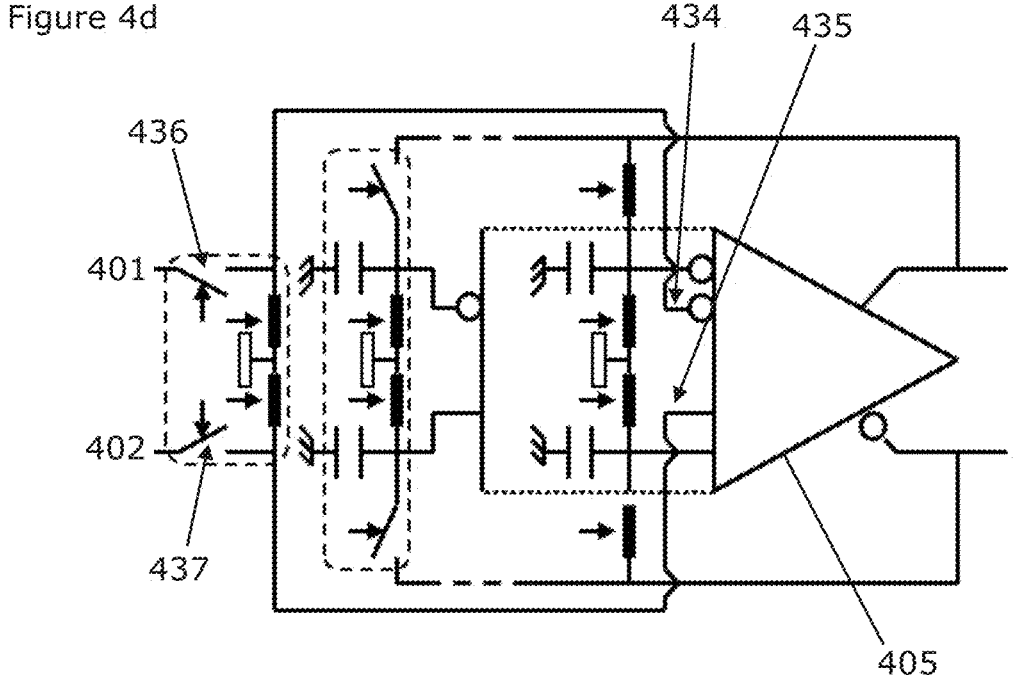
FIG. 4c shows an example embodiment of an amplifier circuit that applies "stacked-dc-coupled" correction.
FIG. 4d shows an example embodiment of an amplifier circuit that applies "parallel-dc-coupling" correction.

FIG. 4c shows an example embodiment of an amplifier circuit that provides "stacked-dc-coupled" correction. The amplifier circuit of FIG. 4c implements offset residue-reduction using a dedicated input path that is different from the signal input one. Various aspects of this type of correction are the same as for the "stacked-ac-coupled" correction of FIG. 4a as is evident from the drawings; these corresponding features will not be discussed again with reference to FIG. 4c. For the "stacked-dc-coupled" correction of FIG. 4c, the amplifier circuit input terminals 401, 402 are selectively connectable directly to the amplifier stage 405 via (additional) dedicated amplifier circuit input terminals 432, 433. That is, the amplifier circuit input terminals 401, 402 are not selectively connectable to the amplifier stage 405 indirectly via capacitors, as they are in FIG. 4a. In this way, the amplifier stage comprises: i) a first set of two amplifier stage input terminals, that are each connected to respectively either: a) the first capacitors of each the residue-reduction storage units; or b) the second capacitors of each the residue-reduction storage units; and ii) a second set of two amplifier stage input terminals, that are each selectively connectable (via an input disconnection switch 436, 437) to the amplifier circuit input terminals 401, 402. Therefore, the second plates of the capacitors 415B, 416B of the final-stage residue-reduction storage unit 409 are connected to a reference terminal instead of to the amplifier circuit input terminals 401, 402 (as they are in FIG. 4a). FIG. 4c can be considered as providing stacked-dc-coupling storage, in parallel with the input signalling.

In FIG. 4c, the amplifier stage comprises a first set of amplifier stage input terminals and a second set of amplifier stage input terminals. Also:

the first capacitor of the final-stage residue-reduction storage unit is indirectly connected to a first amplifier stage input terminal of the first set of amplifier stage input terminals via the first capacitor of the first-stage residue-reduction storage unit; and the second capacitor of the final-stage residue-reduction storage unit is indirectly connected to a second amplifier stage input terminal of the first set of amplifier stage input terminals via the second capacitor of the final-stage residue-reduction storage unit.

When the amplifier circuit is in the operational configuration:

the first amplifier circuit input terminal is connected to a first amplifier stage input terminal of the second set of amplifier stage input terminals; and the second amplifier circuit input terminal is connected to a second amplifier stage input terminal of the second set of amplifier stage input terminals.

FIG. 4d shows an example embodiment of an amplifier circuit that provides "parallel-dc-coupling" correction. The amplifier circuit of FIG. 4d implements offset residue-reduction using a dedicated input path per storage unit, which are different from the signal input path. Again, various aspects of this type of correction are the same as for the "stacked-ac-coupled" correction of FIG. 4a as is evident from the drawings; these corresponding features will not be discussed again with reference to FIG. 4d. In the "parallel-dc-coupled" configuration of FIG. 4d, the amplifier circuit input terminals 401, 402 are selectively connectable directly to the amplifier stage 405 via dedicated amplifier stage input terminals 434, 435. In the same way as for FIG. 4c, the amplifier circuit input terminals 401, 402 of FIG. 4d are not selectively connectable to the amplifier stage 405 indirectly via capacitors. In this way, the amplifier stage 405 comprises a plurality of sets of input terminals: i) one set that is selectively connectable (via input disconnection switches 436, 437) to the amplifier circuit input terminals 401, 402; and ii) one set for each of the plurality of residue-reduction storage units—wherein each of these amplifier stage input terminals is connected to the first plate of one of the capacitors in the residue-reduction storage units. The second plates of each of the first-stage capacitors 415A, 416A and the second plates of each of the final-stage capacitors 415B, 416B are connected to a reference terminal. In this example, the signals provided by all of the dedicated paths to either the positive or negative amplifier stage input terminals adds inside the amplifier stage 405. FIG. 4d can be considered as providing parallel-dc-coupling storage.

In FIG. 4d, the amplifier stage comprises a first set of amplifier stage input terminals, a second set of amplifier stage input terminals, and a third set of amplifier stage input terminals. Also:

the first capacitor of the first-stage residue-reduction storage unit is connected to a first amplifier stage input terminal of the first set of amplifier stage input terminals;

the second capacitor of the first-stage residue-reduction storage unit is connected to a second amplifier stage input terminal of the first set of amplifier stage input terminals;

the first capacitor of the final-stage residue-reduction storage unit is connected to a first amplifier stage input terminal of the second set of amplifier stage input terminals;

the second capacitor of the final-stage residue-reduction storage unit is connected to a second amplifier stage input terminal of the second set of amplifier stage input terminals; and When the amplifier circuit is in the operational configuration:

the first amplifier circuit input terminal is connected to a first amplifier stage input terminal of the third set of amplifier stage input terminals; and the second amplifier circuit input terminal is connected to a second amplifier stage input terminal of the third set of amplifier stage input terminals.

Figure 7A:
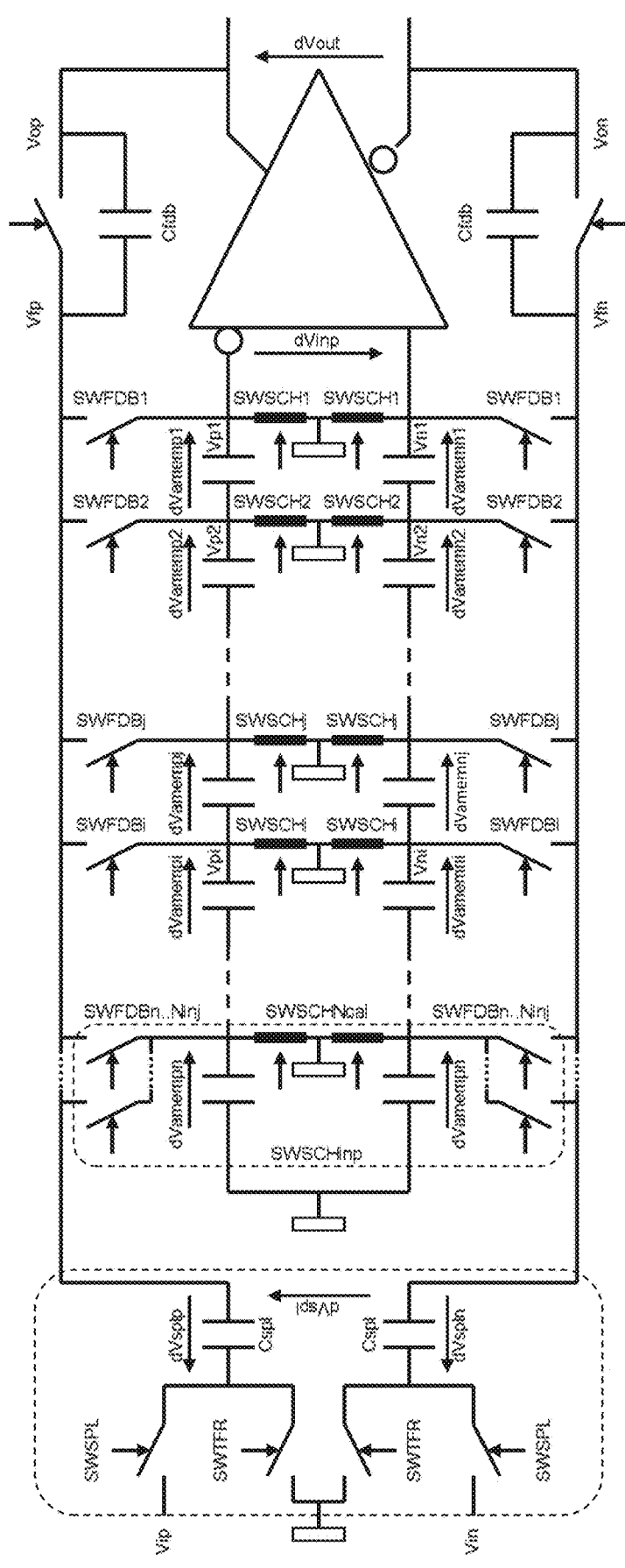
FIG. 7a shows an example embodiment of an amplifier circuit in a switched capacitor amplifier configuration.
Figure 8A:
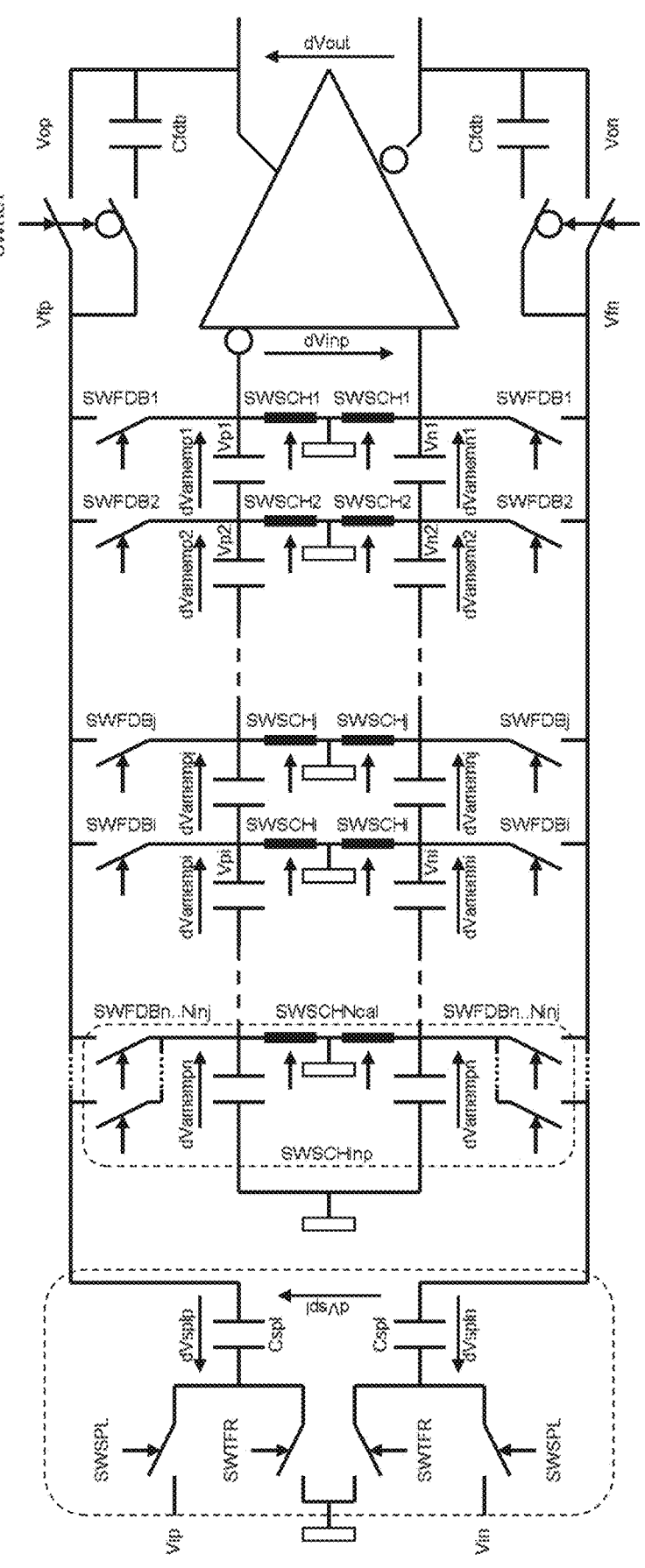
FIG. 8a shows an example embodiment of an amplifier circuit in a switched capacitor integrator configuration.

As will be mentioned below with reference to FIGS. 7a and 8a, the mechanism detailed in the description above also applies for a gain amplifier implementation (FIG. 7a), and for an integrator implementation (FIG. 8a).

One or more of the embodiments described in this document provide one or more of the following technical advantages:

In few cycles (e.g. 2 to 5), extremely high accuracy can be reached, even if intrinsic offset is very high.

Incomplete settling between residue-reduction steps (with the potential exception of the final one) can be accommodated.

Low gain stages are supported (as the offset reduced as Gdc to the power of Ncycles).

No high accuracy digital to analogue converter (DAC) is required.

No digital filtering is required.

Charge injection can be cleaned with few extra clock cycles.

It is compatible with cascade of gain stage.

No extra gain stage in feedback path (no need to compensate for its extra offset).

Only final stage drives the noise contribution; its storage capacitors are adjusted to accommodate with noise specification.

Any imperfections (charge injection, noise, etc. . . . ) from previous step can be cancelled by the next step.

FIGS. 5a-g show an example embodiment of the operation of an amplifier circuit of the present disclosure. The amplifier circuit of FIGS. 5a-g applies "stacked-ac-coupling" correction in the same way as that shown in FIG. 4a, although in FIGS. 5a-g there are five residue-reduction storage units shown.

Figure 5A:
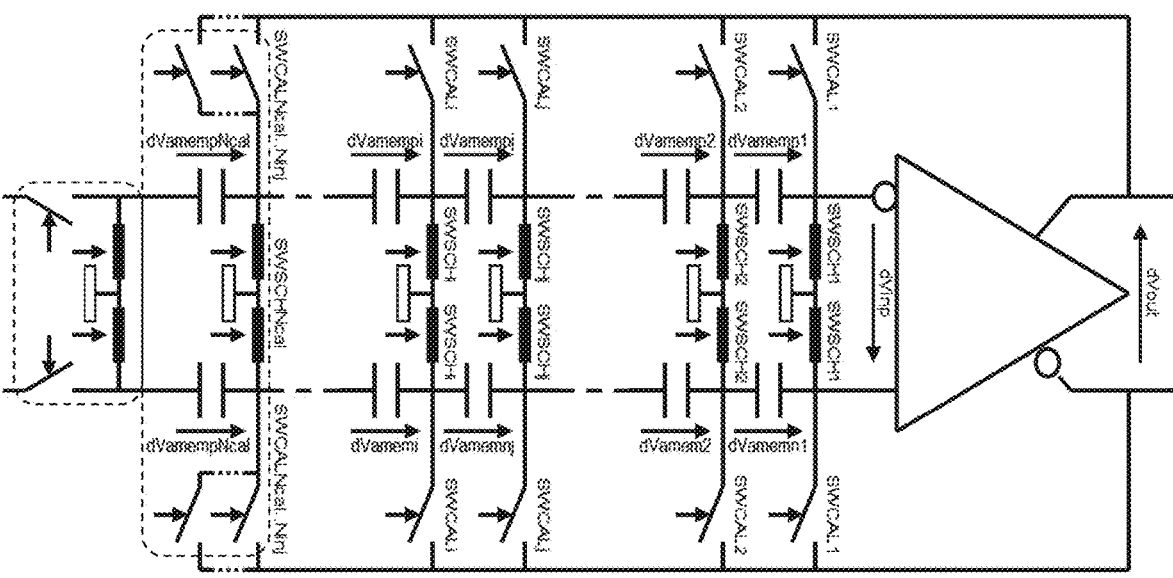
FIGS. 5a-g show an example embodiment of the operation of an amplifier circuit of the present disclosure.

FIG. 5a shows the amplifier circuit in an initial configuration in which the amplifier circuit input terminals are disconnected from the amplifier stage, and in which all of the capacitors of the residue-reduction storage units are discharged to ground.

Figure 5B:
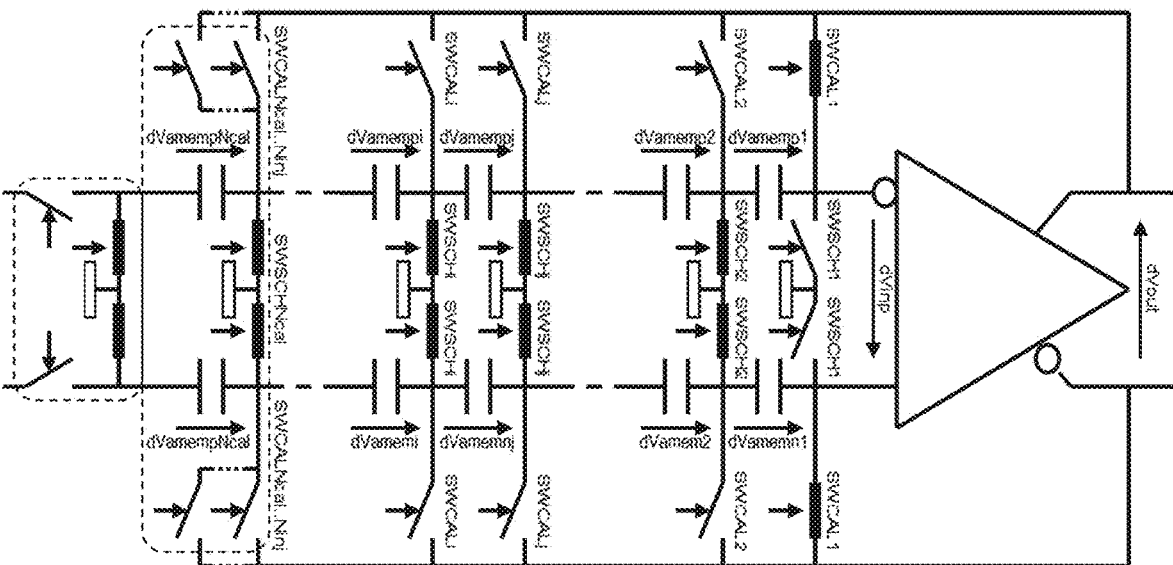

FIG. 5b shows the amplifier circuit in a first residue-reduction configuration in which the capacitors of the first-stage residue-reduction storage unit are charged by a residue voltage at the amplifier stage output terminals.

Figure 5C:
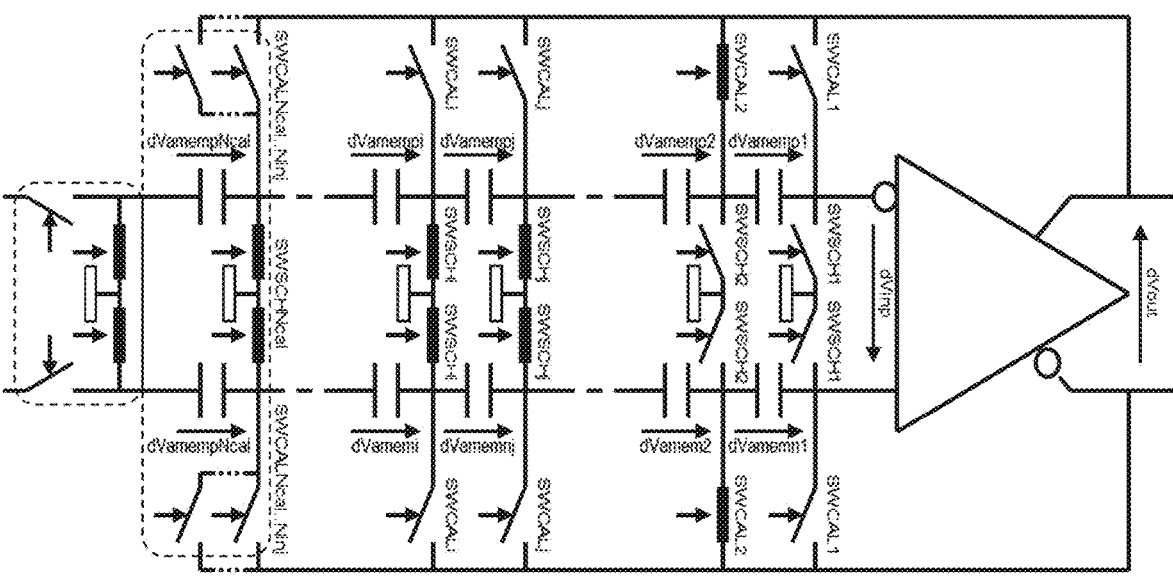

FIG. 5c shows the amplifier circuit in a second residue-reduction configuration in which the capacitors of the second-stage residue-reduction storage unit are charged by a residue voltage at the amplifier stage output terminals.

Figure 5D:
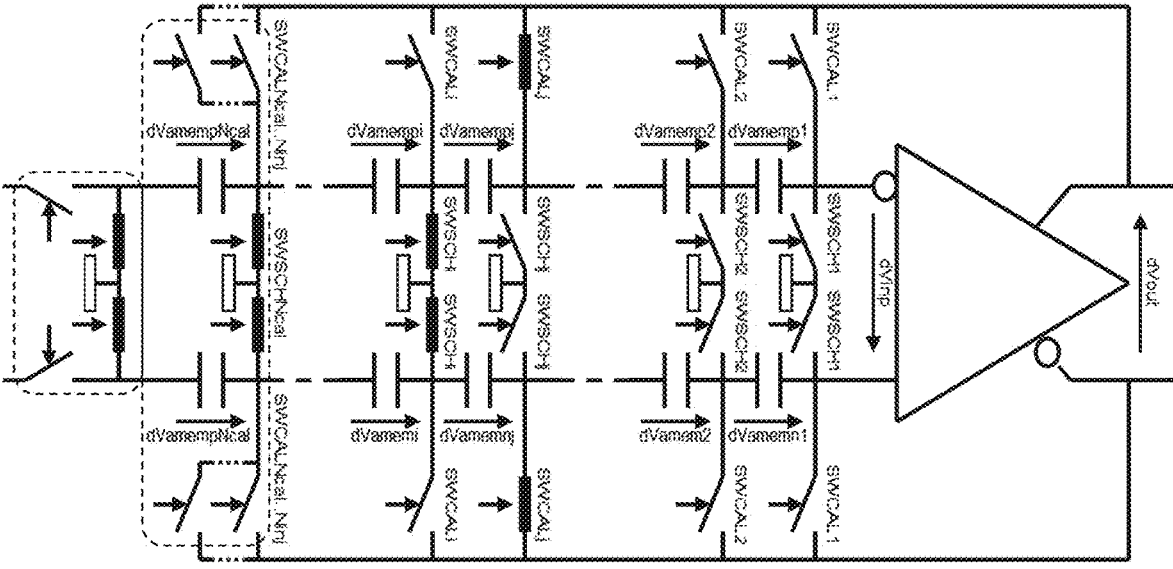

FIG. 5d shows the amplifier circuit in an intermediate residue-reduction configuration in which the capacitors of the third-stage residue-reduction storage unit (as it is shown in FIG. 5d, although it will be appreciated that there could be any number of additional intervening residue-reduction storage units) are charged by a residue voltage at the amplifier stage output terminals.

Figure 5E:
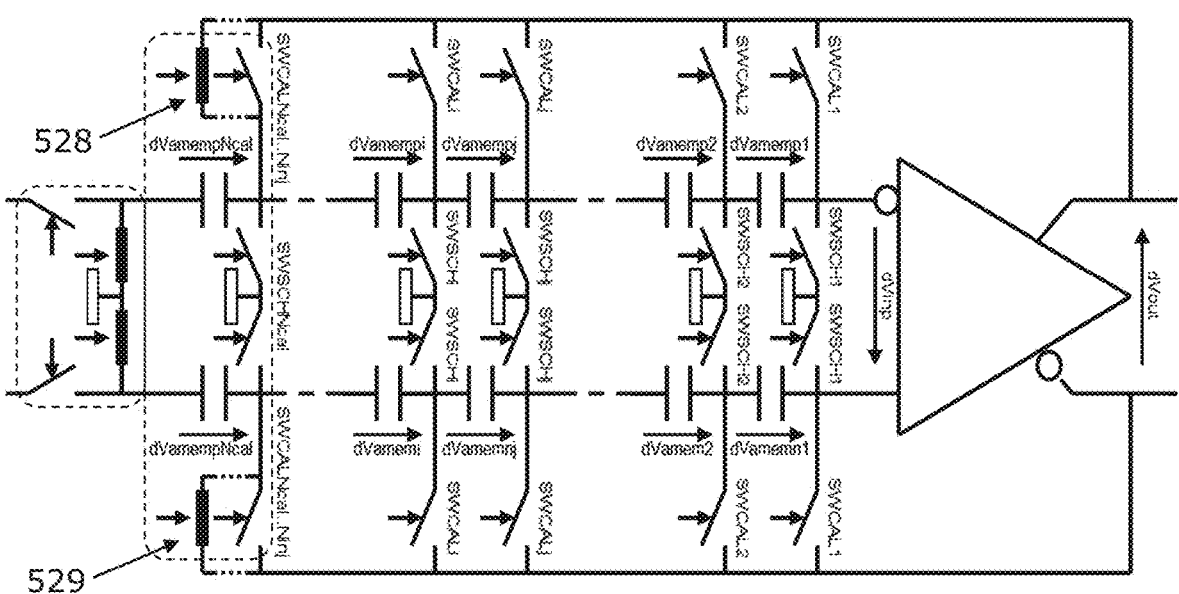

FIG. 5e shows the amplifier circuit in an initial sub-state (injection) of a final-stage residue-reduction configuration, in which the capacitors of the final-stage residue-reduction storage unit are charged by a residue voltage at the amplifier stage output terminals. The capacitors of the final-stage residue-reduction storage unit are selectively connectable to a respective one of the amplifier stage output terminals via one or more of a plurality of final-stage sub-switches 528, 529 in parallel. As indicated above, splitting the final-stage switches (SWCALi) into Ninj parts can assist with reducing charge injection.

Figure 5F:
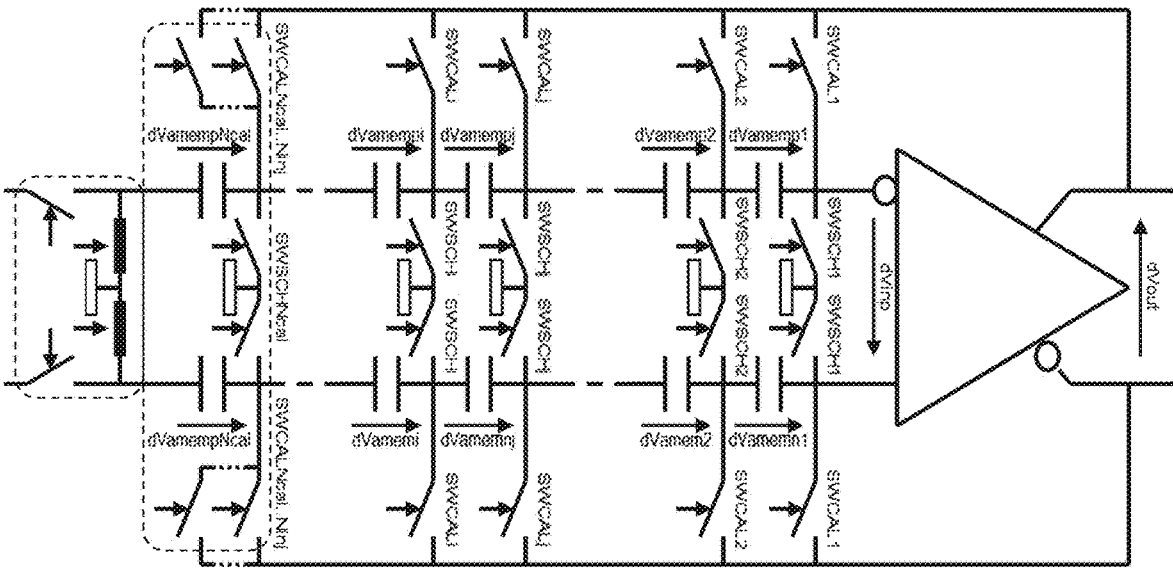

FIG. 5f shows the amplifier circuit in a final sub-state (injection) of the final-stage residue-reduction configuration, in which the capacitors of all of the residue-reduction storage units have been charged and therefore the amplifier circuit is ready to be placed in the operational configuration such that it can amplify input signalling that is received at the amplifier circuit input terminals.

Figure 5G:
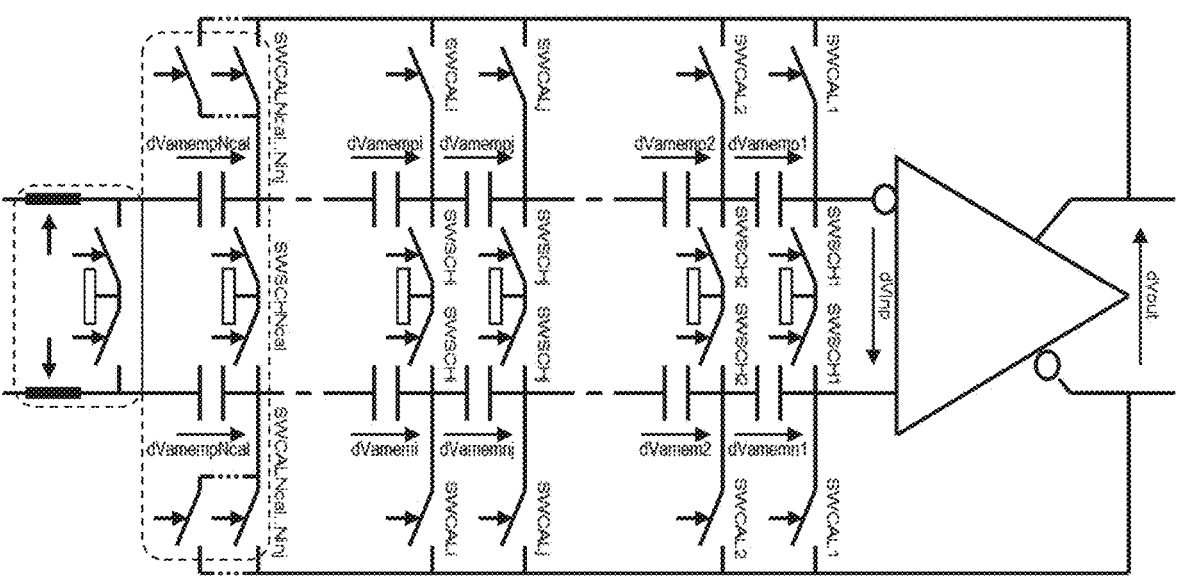

FIG. 5g shows the amplifier circuit in the operational configuration, in which the amplifier circuit input terminals are connected to the amplifier stage terminals via a series connection of the capacitors in each of the residue-reduction storage units. The amplifier stage output terminals are still disconnected from each of the capacitors (in the same way that is shown in FIG. 5f).

The operation of the amplifier circuit shown in FIGS. 5a-g can be expressed as follows (using the symbols and labels that are described above and shown in various drawings):

Step=1, $$dVamemi=0 \text{ for } i>1,$$

$$\text{sum}(dVamemi)=0$$

$$dVout=-Gdc*(dVout+Kc*0+\text{Off})=-\text{Off}*(Gdc/(1+Gdc)),$$

$$dVamem1=dVout=-\text{Off}*Gdc/(1+Gdc)$$

Step=2, $$dVamemi=0 \text{ for } i>2,$$

$$\text{sum}(dVamemei)=dVamem1=-\text{Off}*(Gdc/(1+Gdc))$$

$$dVout=-Gdc*(dVout-Kc*\text{Off}*Gdc/(1+Gdc)+\text{Off})$$

$$dVout=-\text{Off}*Gdc/(1+Gdc)*(1-Kc*Gdc/(1+Gdc)),$$

$$dVamem2=dVout=-\text{Off}*Gdc/(1+Gdc)*(1-Kc*Gdc/(1+Gdc))$$

Step=3, $$dVamemi=0 \text{ for } i>1,$$

$$\text{sum}(dVamemei)=-\text{Off}*Gdc/(1+Gdc)-\text{Off}*Gdc/(1+Gdc)*(1-Kc*Gdc/(1+Gdc))$$

$$dVout=Gdc*(dVout-Kc*\text{Off}*Gdc/(1+Gdc)-\text{Off}*Gdc/(1+Gdc)*(1-Kc*Gdc/(1+Gdc))+\text{Off})$$

$$dVout=-\text{Off}*(Gdc/(1+Gdc))*(1-Kc*Gdc/(1+Gdc))^2,$$

$$dVamem2=dVout=-\text{Off}*(Gdc/(1+Gdc))*(1-Kc*Gdc/(1+Gdc))^2 \text{ etc.} \ldots$$

After Ncal cycles, the residual offset appears back to input (in amplification phase) as $$\text{Off\_res}=1/Gdc*\text{Off}*Gdc/(1+Gdc)*(1-Kc*Gdc/(1+Gdc))^{(Ncal-1)}$$

Assuming $Kc<1$, $Gdc*(1-Kc)>>1$ and $Gdc>>1$ it comes $$\text{Off\_res}\sim 1/Gdc*(1-Kc)^{(Ncal-1)}$$

Assuming $Kc=1$ and $Gdc \gg 1$

Off_res~$1/(Gdc \char`\^ Ncal)$

Finally, the process completes with the last switches smoothly switching off. This can be achieved by splitting the last switches in multiple smallest parts (Ninj) that are switched-off sequentially over the Ninj extra sub-cycles. Note, that these parts do not have to be built from the same unity switch (which can be used for one or more of the other switches). Their sizes can be varied according to any pattern (binary, etc. . . . ) as long as they decrease from biggest to smallest one (that the technology could offer); in this case, the switching-off sequence starts from the biggest one and ends with the smallest one. @ step "j" (Ncal<=j<(Ncal+Ninj))

SWSHCi i<j=> open already selected storage cells SWSHCi remain open

SWCALi i<j=> open already selected storage cells SWCALi remain open

SWSHCNcal=> open current storage cell SWSHCNcal is open

SWCALi i<j=> open already selected cal switches of storage cells Ncal open

Figure 6A:
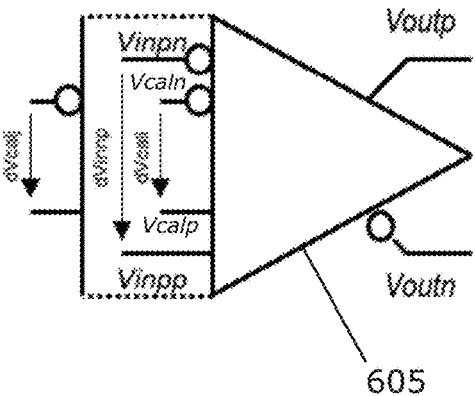
FIG. 6a illustrates an amplifier stage that has multiple sets of input terminals, such as the ones shown in FIGS. 4c and 4d.

SWCALi i>j=> closed not yet selected cal switches of storage cell Ncal still closed SWCALi i=j=> closed current cal switch of storage cell still closed FIG. 6a illustrates an amplifier stage 605 that has multiple sets of input terminals, such as the ones shown in FIGS. 4c and 4d.

Figures 6B, 6C, 6D:
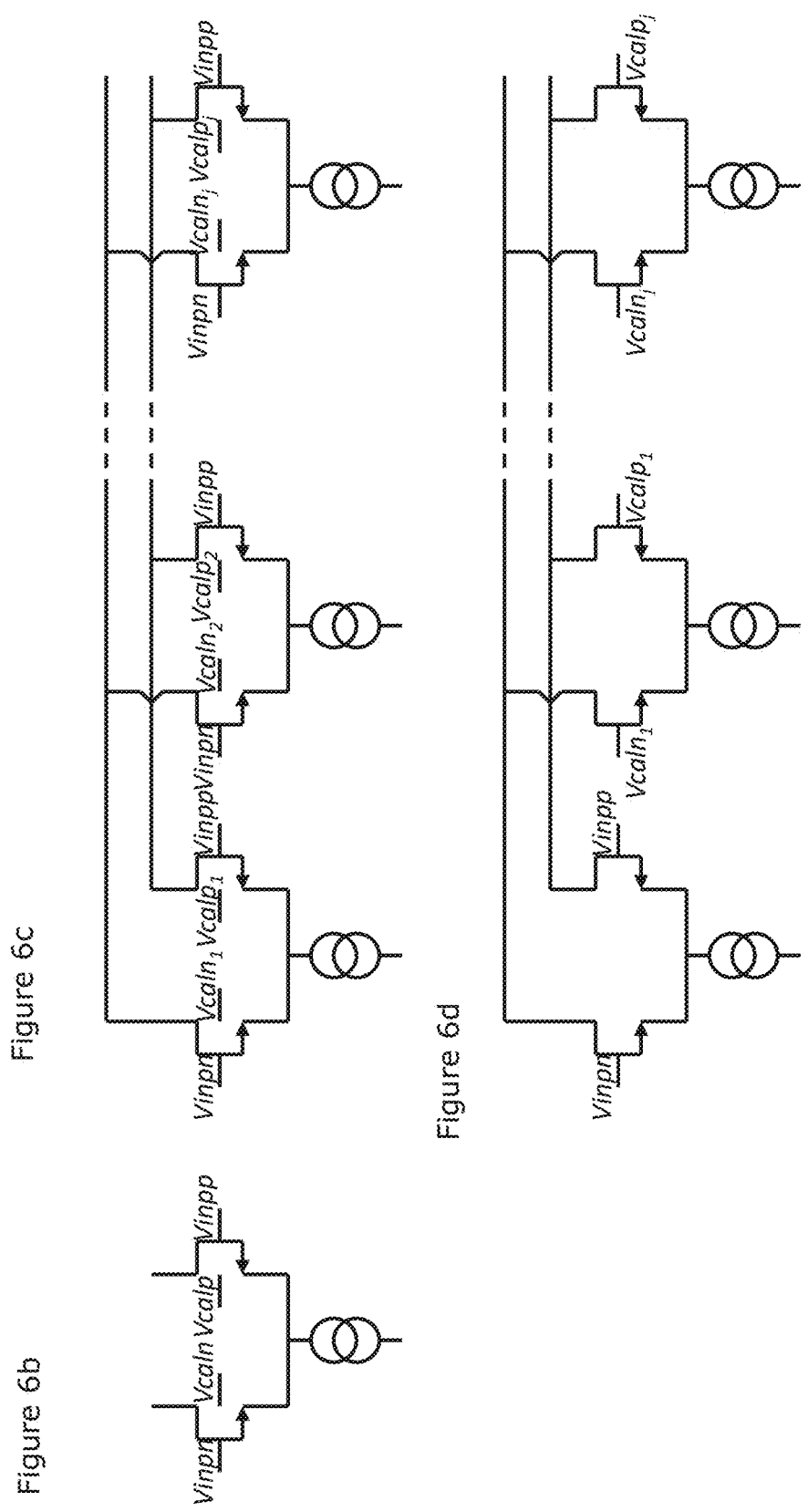

FIGS. 6b-d depict some arrangements for building the amplifier stage 605 of FIG. 6a. In this example, the amplifier stage is implemented as an operational amplifier (opamp) input stage in a differential configuration. FIG. 6b shows dc-coupled calibration using back-gates, which is suitable for use in the amplifier circuit of FIG. 4c. FIG. 6c shows parallel-dc-coupled calibration using back-gates, which is suitable for use in the amplifier circuit of FIG. 4d. FIG. 6d shows parallel-dc-coupled calibration (dc-coupling j=1), which is suitable for use in the amplifier circuit of FIG. 4d.

In FIG. 6b, the amplifier stage comprises a differential circuit that includes:

a first transistor having: a gate terminal, a back-gate terminal and a conduction channel;

a second transistor having: a gate terminal, a back-gate terminal and a conduction channel; and a current source.

In FIG. 6c, the amplifier stage comprises a differential circuit that includes:

a first transistor having: a gate terminal, a back-gate terminal and a conduction channel;

a second transistor having: a gate terminal, a back-gate terminal and a conduction channel;

a third transistor having: a gate terminal, a back-gate terminal and a conduction channel;

a fourth transistor having: a gate terminal, a back-gate terminal and a conduction channel;

a first current source; and a second current source.

The components of FIG. 6c are connected together as follows:

the gate terminal of the first transistor is connected to the first amplifier stage input terminal of the third set of amplifier stage input terminals;

the gate terminal of the second transistor is connected to the second amplifier stage input terminal of the third set of amplifier stage input terminals;

the gate terminal of the third transistor is connected to the first amplifier stage input terminal of the third set of amplifier stage input terminals;

the gate terminal of the fourth transistor is connected to the second amplifier stage input terminal of the third set of amplifier stage input terminals;

the back-gate terminal of the first transistor is connected to the first amplifier stage input terminal of the first set of amplifier stage input terminals;

the back-gate terminal of the second transistor is connected to the second amplifier stage input terminal of the first set of amplifier stage input terminals;

the back-gate terminal of the third transistor is connected to the first amplifier stage input terminal of the second set of amplifier stage input terminals;

the back-gate terminal of the fourth transistor is connected to the second amplifier stage input terminal of the second set of amplifier stage input terminals;

the first current source is configured to provide output signalling to the first amplifier stage output terminal via the conduction terminal of the first transistor;

the first current source is configured to provide output signalling to the second amplifier stage output terminal via the conduction terminal of the second transistor;

the second current source is configured to provide output signalling to the first amplifier stage output terminal via the conduction terminal of the third transistor; and the second current source is configured to provide output signalling to the second amplifier stage output terminal via the conduction terminal of the fourth transistor.

In FIG. 6d, the amplifier stage comprises a differential circuit that includes:

a first transistor having: a gate terminal, a back-gate terminal and a conduction channel;

a second transistor having: a gate terminal and a conduction channel;

a third transistor having: a gate terminal and a conduction channel;

a fourth transistor having: a gate terminal and a conduction channel;

a fifth transistor having: a gate terminal and a conduction channel;

a sixth transistor having: a gate terminal and a conduction channel a first current source;

a second current source; and a third current source.

The components of FIG. 6d are connected together as follows:

the gate terminal of the first transistor is connected to the first amplifier stage input terminal of the third set of amplifier stage input terminals;

the gate terminal of the second transistor is connected to the second amplifier stage input terminal of the third set of amplifier stage input terminals;

the gate terminal of the third transistor is connected to the first amplifier stage input terminal of the first set of amplifier stage input terminals;

the gate terminal of the fourth transistor is connected to the second amplifier stage input terminal of the first set of amplifier stage input terminals;

the gate terminal of the fifth transistor is connected to the first amplifier stage input terminal of the second set of amplifier stage input terminals;

the gate terminal of the sixth transistor is connected to the second amplifier stage input terminal of the second set of amplifier stage input terminals;

the first current source is configured to provide output signalling to the first amplifier stage output terminal via the conduction terminal of the first transistor;

the first current source is configured to provide output signalling to the second amplifier stage output terminal via the conduction terminal of the second transistor;

the second current source is configured to provide output signalling to the first amplifier stage output terminal via the conduction terminal of the third transistor;

the second current source is configured to provide output signalling to the second amplifier stage output terminal via the conduction terminal of the fourth transistor;

the third current source is configured to provide output signalling to the first amplifier stage output terminal via the conduction terminal of the fifth transistor; and the third current source is configured to provide output signalling to the second amplifier stage output terminal via the conduction terminal of the sixth transistor.

Some trade-off can be made to save power because, due to the techniques disclosed herein, the bias current of the calibration pairs can be reduced. Even if the transconductance of the calibration path is lower than the transconductance of the input path, the techniques disclosed herein still work as long as the calibration path gain remains greater than unity. (It is accounted for due to the Kc factor depicted in equation set below.) Note that all calibration bias currents do not have to have same value. Fully depleted silicon on insulator (FDSOI) technology can be used, where the back-gates are used to receive the calibration voltages. This represents a further enhancement to the techniques that are described above in terms of providing high accuracy without any current penalty.

It will appreciated from the above description that a more general form exists

The compensations can physically happen either in series ("ac-coupling") or in parallel ("dc-coupling") of the signal The analogue storage cells' offset/residues accumulate from step to step The accumulation can be made by either stacking or paralleling storage elements.

In any Case. The Amplifier Outputs can be Expressed as:

$$dVout=-Gdc*(dVinp+KcdVcal+Off)$$

Gdc is amplifier DC gain

Kc accounts for any gain detuning between signal and compensation paths

Off is goblal offset (sum of all intrinsic offsets of each opamp inputs)

dVout=Voutp−Voutn, Voutp=dVout/2+Vocm, Voutn=−dVout/2+Vocm dVinp=Vinp−Vref (single input), dVinp=Vinp−Vinn (otherwise), dVcal=Vcal−Vrefcal (single feedback), dVcal=Vcalp−Vcaln (otherwise), dVcal=sum(dVamemei)

dVamemei=dVamempi−dVamemni dVamempi=(Vamemopi−Vamemeipi), dVamemni= (Vamemoni−Vamemini)

During calibration, inputs are shorted (dVsig=0) to common node and amplifier outputs are sequentially feedback to compensation networks using SWCALi switches (negative sign as retro-action). The sequence starts with all storage cells short-circuit switches closed and all feedback storages cells feedback switches open.

Steps are indexed from 1 to Ncal and then from Ncal to Ncal+Ninj in case latest SWCAL switch is split (Ninj>1)

@ step "j" (1<=j<Ncal)

SWSHCi i>j=> closed not yet selected storage cells SWSHCi are closed

SWCALi i>j=> open not yet selected storage cells SWCALi remain open

SWSHCi i<j=> open already selected storage cells SWSHCi remain open

SWCALi i<j=> open already selected storage cells SWCALi remain open

SWSCHj=> open currently selected storage cell SWSHCj are open

SWCALj=> closed currently selected storage cell SWCALj are closed

It will be appreciated from this disclosure that:

There exist a plurality of way to organize the compensation network; all arrangements that accumulate the current residue to the previous residue to the compensation path will work well.

Calibration noise is mainly driven by the final step; i.e. the size of the final AMEMi capacitance. As a consequence, initial AMEMi elements can be made small to save area.

Initial Voltage value of AMEMi does not matter.

AMEMi stored voltage can drift until final step happens; subsequent steps compensate for any drift, injection etc. . . . To summarize, this concept is tolerant to any error/drift that happens from initial step to final one. Nevertheless, once the sequence is complete, then more drift should be avoided.

Any of the implementations that are described herein can also be used for a GAIN or an INTEGRATOR configuration, by simply replacing SWCAL with SWFDB.

FIG. 7a shows an example embodiment that includes the concept that is described above, but this time for a switched capacitor amplifier configuration.

Figure 7B:
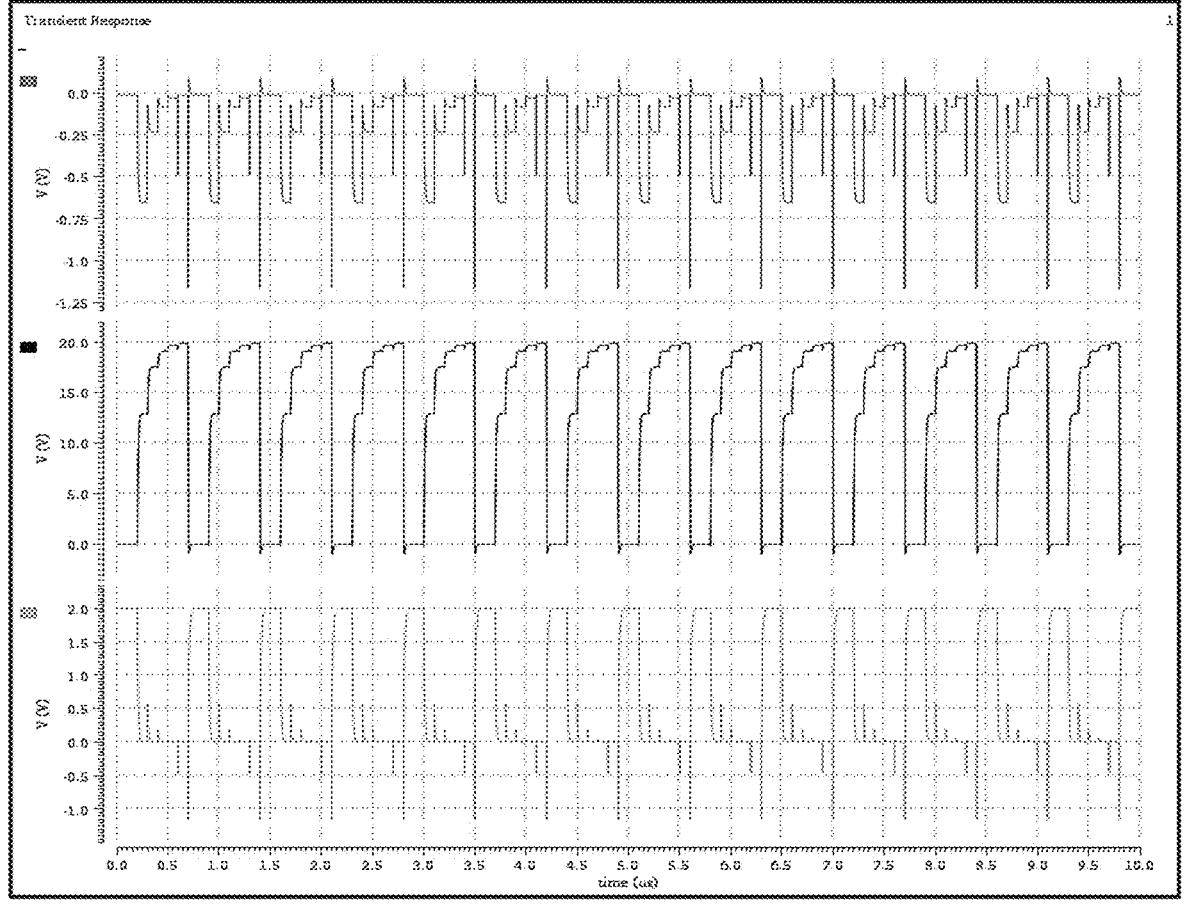

FIG. 7b shows a plot that illustrates the performance of the circuit of FIG. 7a.

FIG. 8a shows an example embodiment that includes the concept that is described above, but this time for a switched capacitor integrator configuration.

Figure 8B:
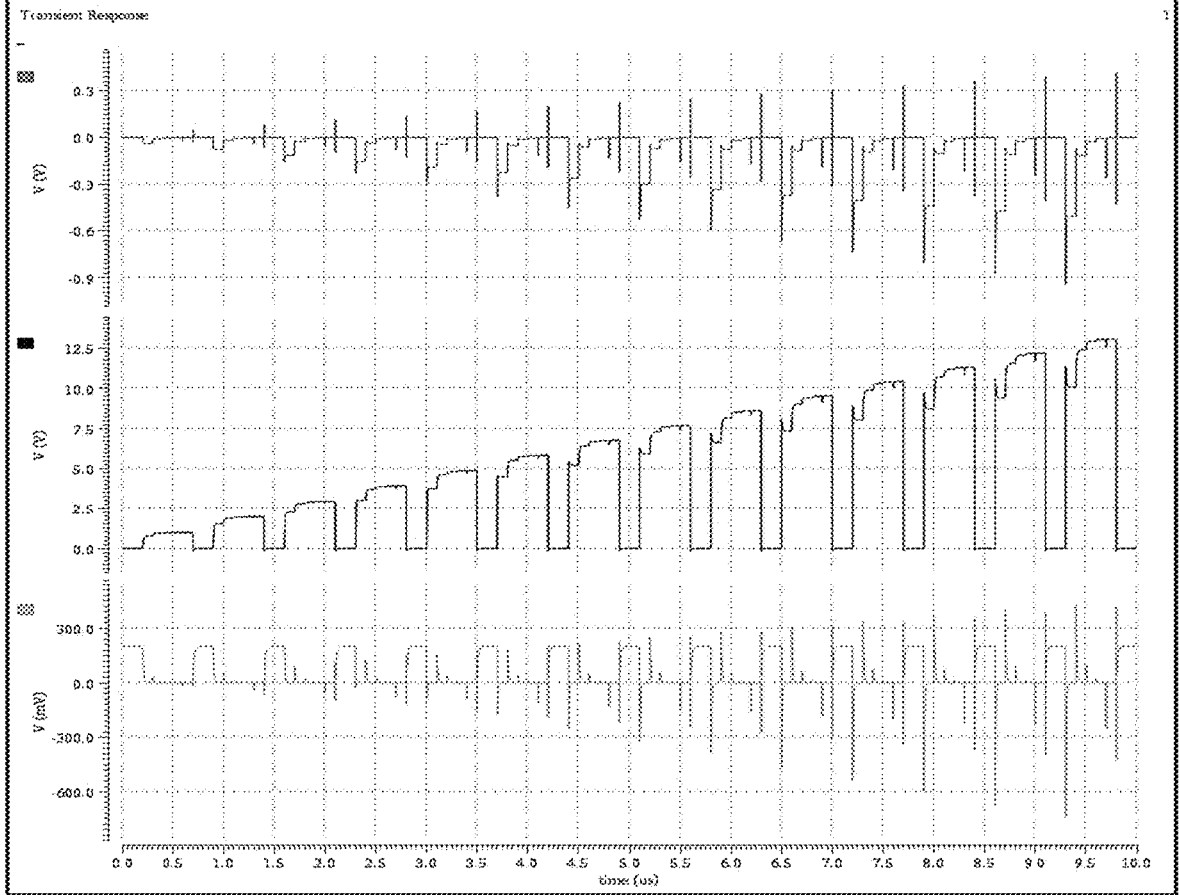

FIG. 8b shows a plot that illustrates the performance of the circuit of FIG. 8a.

Examples disclosed herein can be considered as relating to a recycling opamp input error technique to enhance accuracy. In some implementations, this can provide analogue successive approximation offset calibration. Discloses herein is a method to enhance accuracy of switch cap circuitry using very low gain amplifier; it recycles the opamp input residue error multiple times. The correction happens only in analog domain.

Examples disclosed herein provide a new way of reaching high accuracy with analogue only calibration and without the need for a high amplifying gain stage; the equivalent high gain is obtained due to multiples steps as Gdc_equi=Gdc^Nsteps.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An amplifier circuit comprising:
a first amplifier circuit input terminal;
a second amplifier circuit input terminal;
a first amplifier circuit output terminal;
a second amplifier circuit output terminal;
an amplifier stage comprising:
    a first amplifier stage input terminal;
    a second amplifier stage input terminal;
    a first amplifier stage output terminal;
    a second amplifier stage output terminal;
wherein the first amplifier stage output terminal is connected to the first amplifier circuit output terminal and the second amplifier stage output terminal is connected to the second amplifier circuit output terminal;
a first-stage residue-reduction storage unit and a final-stage residue-reduction storage unit, each respectively comprising:

a first capacitor that is connected to the first amplifier stage input terminal; and
a second capacitor that is connected to the second amplifier stage input terminal,
wherein each of the first capacitor and the second capacitor comprises a first plate and a second plate; and
a switching network that is operable to control the amplifier circuit according to the following operational configurations:
a first residue-reduction configuration, in which:
    the first amplifier circuit input terminal is not connected to the first amplifier stage input terminal;
    the second amplifier circuit input terminal is not connected to the second amplifier stage input terminal;
    the first amplifier stage output terminal is connected to the first capacitor of the first-stage residue-reduction storage unit;
    the second amplifier stage output terminal is connected to the second capacitor of the first-stage residue-reduction storage unit;
    the first amplifier stage output terminal is not connected to the first capacitor of the final-stage residue-reduction storage unit; and
    the second amplifier stage output terminal is not connected to the second capacitor of the final-stage residue-reduction storage unit;
a second residue-reduction configuration, in which:
    the first amplifier circuit input terminal is not connected to the first amplifier stage input terminal;
    the second amplifier circuit input terminal is not connected to the second amplifier stage input terminal;
    the first amplifier stage output terminal is not connected to the first capacitor of the first-stage residue-reduction storage unit;
    the second amplifier stage output terminal is not connected to the second capacitor of the first-stage residue-reduction storage unit;
    the first amplifier stage output terminal is connected to the first capacitor of the final-stage residue-reduction storage unit; and
    the second amplifier stage output terminal is connected to the second capacitor of the final-stage residue-reduction storage unit; and
an operational configuration, in which:
    the first amplifier circuit input terminal is connected to the first amplifier stage input terminal;
    the second amplifier circuit input terminal is connected to the second amplifier stage input terminal;
    the first amplifier stage output terminal is not connected to the first capacitor of the first-stage residue-reduction storage unit;
    the second amplifier stage output terminal is not connected to the second capacitor of the first-stage residue-reduction storage unit;
    the first amplifier stage output terminal is not connected to the first capacitor of the final-stage residue-reduction storage unit; and
    the second amplifier stage output terminal is not connected to the second capacitor of the final-stage residue-reduction storage unit.

2. The amplifier circuit of claim 1, wherein:
the first capacitor of the final-stage residue-reduction storage unit is indirectly connected to the first amplifier stage input terminal via the first capacitor of the first-stage residue-reduction storage unit; and the second capacitor of the final-stage residue-reduction storage unit is indirectly connected to the second amplifier stage input terminal via the second capacitor of the final-stage residue-reduction storage unit.

3. The amplifier circuit of claim 2, wherein, when the amplifier circuit is in the operational configuration:

the first amplifier circuit input terminal is indirectly connected to the first amplifier stage input terminal via: i) the first capacitor of the final-stage residue-reduction storage; and ii) the first capacitor of the first-stage residue-reduction storage unit; and the second amplifier circuit input terminal is indirectly connected to the second amplifier stage input terminal via: i) the second capacitor of the final-stage residue-reduction storage; and ii) the second capacitor of the first-stage residue-reduction storage unit.

4. The amplifier circuit of claim 2, wherein the amplifier stage comprises a first set of amplifier stage input terminals and a second set of amplifier stage input terminals, wherein:

the first capacitor of the final-stage residue-reduction storage unit is indirectly connected to a first amplifier stage input terminal of the first set of amplifier stage input terminals via the first capacitor of the first-stage residue-reduction storage unit;

the second capacitor of the final-stage residue-reduction storage unit is indirectly connected to a second amplifier stage input terminal of the first set of amplifier stage input terminals via the second capacitor of the final-stage residue-reduction storage unit; and when the amplifier circuit is in the operational configuration:

the first amplifier circuit input terminal is connected to a first amplifier stage input terminal of the second set of amplifier stage input terminals; and the second amplifier circuit input terminal is connected to a second amplifier stage input terminal of the second set of amplifier stage input terminals.

5. The amplifier circuit of claim 4, wherein the amplifier stage comprises a differential circuit comprising:

a first transistor having: a gate terminal, a back-gate terminal and a conduction channel;

a second transistor having: a gate terminal, a back-gate terminal and a conduction channel; and a current source;

wherein:

the gate terminal of the first transistor is connected to the first amplifier stage input terminal of the second set of amplifier stage input terminals;

the gate terminal of the second transistor is connected to the second amplifier stage input terminal of the second set of amplifier stage input terminals;

the back-gate terminal of the first transistor is connected to the first amplifier stage input terminal of the first set of amplifier stage input terminals;

the back-gate terminal of the second transistor is connected to the second amplifier stage input terminal of the first set of amplifier stage input terminals;

the current source is configured to provide output signalling to the first amplifier stage output terminal via a conduction terminal of the first transistor; and the current source is configured to provide output signalling to the second amplifier stage output terminal via a conduction terminal of the second transistor.

6. The amplifier circuit of claim 2, wherein the amplifier stage comprises a first set of amplifier stage input terminals, a second set of amplifier stage input terminals, and a third set of amplifier stage input terminals wherein:

the first capacitor of the first-stage residue-reduction storage unit is connected to a first amplifier stage input terminal of the first set of amplifier stage input terminals;

the second capacitor of the first-stage residue-reduction storage unit is connected to a second amplifier stage input terminal of the first set of amplifier stage input terminals;

the first capacitor of the final-stage residue-reduction storage unit is connected to a first amplifier stage input terminal of the second set of amplifier stage input terminals;

the second capacitor of the final-stage residue-reduction storage unit is connected to a second amplifier stage input terminal of the second set of amplifier stage input terminals; and when the amplifier circuit is in the operational configuration:

the first amplifier circuit input terminal is connected to a first amplifier stage input terminal of the third set of amplifier stage input terminals; and the second amplifier circuit input terminal is connected to a second amplifier stage input terminal of the third set of amplifier stage input terminals.

7. The amplifier circuit claim 6, wherein the amplifier stage comprises a differential circuit comprising:

a first transistor having: a gate terminal, a back-gate terminal and a conduction channel;

a second transistor having: a gate terminal, a back-gate terminal and a conduction channel;

a third transistor having: a gate terminal, a back-gate terminal and a conduction channel;

a fourth transistor having: a gate terminal, a back-gate terminal and a conduction channel;

a first current source; and a second current source;

wherein:

the gate terminal of the first transistor is connected to the first amplifier stage input terminal of the third set of amplifier stage input terminals;

the gate terminal of the second transistor is connected to the second amplifier stage input terminal of the third set of amplifier stage input terminals;

the gate terminal of the third transistor is connected to the first amplifier stage input terminal of the third set of amplifier stage input terminals;

the gate terminal of the fourth transistor is connected to the second amplifier stage input terminal of the third set of amplifier stage input terminals;

the back-gate terminal of the first transistor is connected to the first amplifier stage input terminal of the first set of amplifier stage input terminals;

the back-gate terminal of the second transistor is connected to the second amplifier stage input terminal of the first set of amplifier stage input terminals;

the back-gate terminal of the third transistor is connected to the first amplifier stage input terminal of the second set of amplifier stage input terminals;

the back-gate terminal of the fourth transistor is connected to the second amplifier stage input terminal of the second set of amplifier stage input terminals;

the first current source is configured to provide output signalling to the first amplifier stage output terminal via a conduction terminal of the first transistor;

the first current source is configured to provide output signalling to the second amplifier stage output terminal via a conduction terminal of the second transistor;

the second current source is configured to provide output signalling to the first amplifier stage output terminal via a conduction terminal of the third transistor; and the second current source is configured to provide output signalling to the second amplifier stage output terminal via a conduction terminal of the fourth transistor.

8. The amplifier circuit of claim 6, wherein the amplifier stage comprises a differential circuit comprising:

a first transistor having: a gate terminal, a back-gate terminal and a conduction channel;

a second transistor having: a gate terminal and a conduction channel;

a third transistor having: a gate terminal and a conduction channel;

a fourth transistor having: a gate terminal and a conduction channel;

a fifth transistor having: a gate terminal and a conduction channel;

a sixth transistor having: a gate terminal and a conduction channel;

a first current source;

a second current source; and a third current source;

wherein:

the gate terminal of the first transistor is connected to the first amplifier stage input terminal of the third set of amplifier stage input terminals;

the gate terminal of the second transistor is connected to the second amplifier stage input terminal of the third set of amplifier stage input terminals;

the gate terminal of the third transistor is connected to the first amplifier stage input terminal of the first set of amplifier stage input terminals;

the gate terminal of the fourth transistor is connected to the second amplifier stage input terminal of the first set of amplifier stage input terminals;

the gate terminal of the fifth transistor is connected to the first amplifier stage input terminal of the second set of amplifier stage input terminals;

28 the gate terminal of the sixth transistor is connected to the second amplifier stage input terminal of the second set of amplifier stage input terminals;

the first current source is configured to provide output signalling to the first amplifier stage output terminal via a conduction terminal of the first transistor;

the first current source is configured to provide output signalling to the second amplifier stage output terminal via a conduction terminal of the second transistor;

the second current source is configured to provide output signalling to the first amplifier stage output terminal via a conduction terminal of the third transistor;

the second current source is configured to provide output signalling to the second amplifier stage output terminal via a conduction terminal of the fourth transistor;

the third current source is configured to provide output signalling to the first amplifier stage output terminal via a conduction terminal of the fifth transistor; and the third current source is configured to provide output signalling to the second amplifier stage output terminal via a conduction terminal of the sixth transistor.

9. The amplifier circuit of claim 1, wherein the switching network comprises first-stage residue-reduction short circuit switches that, when closed, provide a connection between the first plates of the first and second capacitors of the first-stage residue-reduction storage unit and a reference terminal.

10. The amplifier circuit of claim 1, wherein the switching network comprises final-stage residue-reduction short circuit switches that are connected between: i) a node between a first plate of the first capacitor of the final-stage residue reduction storage unit and a second plate of the first capacitor of the first-stage residue reduction storage unit; and ii) a reference terminal.

11. The amplifier circuit of claim 4, wherein the capacitors of the final-stage residue-reduction storage unit have a higher capacitance than those of the first-stage residue-reduction storage unit.

12. The amplifier circuit of claim 4, wherein one or more switches of the switching network further comprise a charge injection compensation switch.

* * * * *